United States Patent
Fukui et al.

(10) Patent No.: US 12,157,172 B1
(45) Date of Patent: Dec. 3, 2024

(54) CUTTING TOOL

(71) Applicant: Sumitomo Electric Industries, Ltd., Osaka (JP)

(72) Inventors: Haruyo Fukui, Osaka (JP); Nozomi Tsukihara, Osaka (JP); Toshihiro Tabata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/568,303

(22) PCT Filed: May 17, 2023

(86) PCT No.: PCT/JP2023/018432
§ 371 (c)(1),
(2) Date: Dec. 8, 2023

(51) Int. Cl.
*B24D 18/00* (2006.01)
*B23B 27/14* (2006.01)
*C23C 14/06* (2006.01)

(52) U.S. Cl.
CPC ............ *B23B 27/148* (2013.01); *C23C 14/06* (2013.01)

(58) Field of Classification Search
CPC ......... B23B 27/148; B24D 3/00; B24D 11/00; B24D 18/00
USPC .............................. 428/386; 51/293, 307, 309
See application file for complete search history.

(56) References Cited

U.S. PATENT DOCUMENTS 10,307,831 B2 * 6/2019 Okude .................... B23B 27/14

FOREIGN PATENT DOCUMENTS

| AT | 510963 B1 * | 8/2012 | ............ C23C 16/34 |
| JP | 2004-066361 A | 3/2004 | |
| JP | 2009125902 A * | 6/2009 | |
| JP | 2009-275293 A | 11/2009 | |
| JP | 2017-206756 A | 11/2017 | |
| WO | WO-2014191505 A1 * | 12/2014 | ............... B22F 9/04 |
| WO | WO-2014191511 A1 * | 12/2014 | ......... C04B 35/5626 |
| WO | WO-2020026390 A1 * | 2/2020 | ............ B23B 27/14 |

OTHER PUBLICATIONS

Written Opinion mailed on Jul. 18, 2023, received for PCT Application PCT/JP2023/018432, filed on May 17, 2023, 6 pages including English Translation.

* cited by examiner

*Primary Examiner* — James E McDonough
(74) *Attorney, Agent, or Firm* — XSENSUS LLP

(57) ABSTRACT

A cutting tool, including: a base; and a coating disposed on the base, wherein the coating includes a first layer, the first layer is composed of an alternate layer in which a first unit layer and a second unit layer are alternately stacked, the first unit layer has a hexagonal crystal structure, the first unit layer is composed of $W(C_{1-a}Na)_x$, a represents 0.3 or more and 0.8 or less, x represents 0.8 or more and 1.2 or less, the second unit layer is composed of $Ti_cSi_{1-c}N$, and c represents 0.80 or more and 0.99 or less.

15 Claims, 7 Drawing Sheets

CUTTING TOOL

CROSS-REFERENCE TO RELATED APPLICATION

The present application is based on PCT filing PCT/JP2023/018432, filed May 17, 2023, the entire contents of which are incorporated herein by reference.

TECHNICAL FIELD

The present disclosure relates to a cutting tool.

BACKGROUND ART

A cutting tool comprising a base and a coating disposed on the base has been conventionally used for cutting processing (PTL 1).

CITATION LIST

Patent Literature

PTL 1: Japanese Patent Laying-Open No. 2004-066361

SUMMARY OF INVENTION

A cutting tool according to an aspect of the present disclosure is a cutting tool comprising:
a base; and
a coating disposed on the base, wherein
the coating includes a first layer,
the first layer is composed of an alternate layer in which a first unit layer and a second unit layer are alternately stacked,
the first unit layer has a hexagonal crystal structure,
the first unit layer is composed of $W(C_{1-a}N_a)_x$,
a represents 0.3 or more and 0.8 or less,
x represents 0.8 or more and 1.2 or less,
the second unit layer is composed of $Ti_cSi_{1-c}N$, and
c represents 0.80 or more and 0.99 or less.

DETAILED DESCRIPTION

Figure 1:
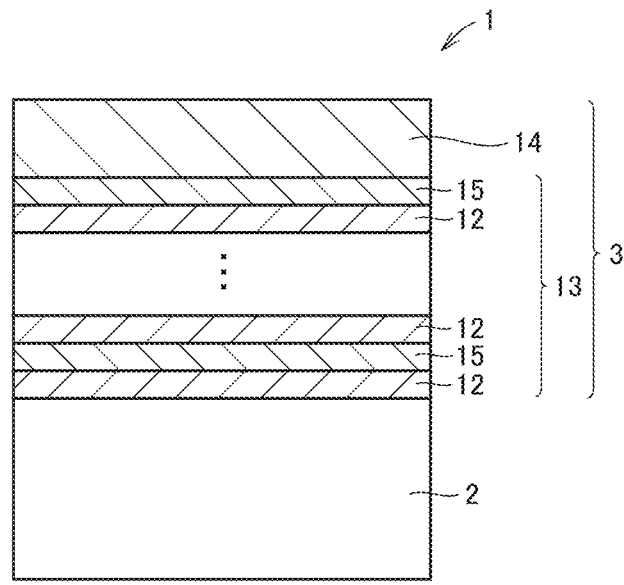
FIG. 1 is a schematic enlarged cross-sectional view of an example of a cutting tool according to Embodiment 1.

Problem to be Solved by the Present Disclosure

Cutting processing serves a central role among manufacturing technology, and evolution of the technology and further sophistication have been continuously required. In the cutting processing technology, high speed, high efficiency, high precision processing, and ultrafine processing have been basically required. As a recent trend, workpiece becomes difficult to cut, and countermeasures therefor are also required. In addition, in the field of cutting processing, Sustainable Development Goals (SDGs) in order to achieve the sustainable and better world until 2030 has attracted more and more attention in recent years. The sustainable development means construction of the social basement that does not impair resources needed for the future generation and that is durable against threads of nature. With improvement of the cutting processing technology, expected is reduction in environmental load such as saving power during product manufacturing derived from reduction in steps, and reduction in waste from cutting processing. In view of such a background, for a cutting tool, development of a coating material for a tool that has a high high-temperature hardness and that has both of hardness and toughness has been directed in order to lengthen a lifetime of the tool.

As the coating material for a tool, a nitride film mainly composed of Ti and Si is proposed (PTL 1). However, a temperature on a cutting edge of the cutting tool during cutting tends to be high because: dry processing without cutting oil agent is required from the viewpoint of SDGs and global environment conservation; a cutting rate becomes higher for improvement of cutting efficiency; and workpiece becomes diverse, specifically, cutting a so-called hard-to-cut material such as heat-resistant alloy and titanium alloy increases in the aircraft field and the medical field. When the temperature on the cutting edge becomes high, the lifetime of the cutting tool becomes considerably short. Therefore, a cutting tool that can exhibit excellent tool lifetime even under such severe cutting conditions is required.

Advantageous Effect of the Present Disclosure

According to the present disclosure, the cutting tool that has a long tool lifetime even in cutting processing performed particularly under conditions of a high temperature on the cutting edge can be provided.

Description of Embodiments

First, aspects of the present disclosure will be listed and described.

(1) A cutting tool according to an aspect of the present disclosure is a cutting tool comprising:
a base; and
a coating disposed on the base, wherein
the coating includes a first layer,
the first layer is composed of an alternate layer in which a first unit layer and a second unit layer are alternately stacked,
the first unit layer has a hexagonal crystal structure,
the first unit layer is composed of $W(C_{1-a}Na)_x$,
a represents 0.3 or more and 0.8 or less,
x represents 0.8 or more and 1.2 or less,
the second unit layer is composed of $Ti_cSi_{1-c}N$, and
c represents 0.80 or more and 0.99 or less.

According to the present disclosure, the cutting tool that has a long tool lifetime even in cutting processing performed particularly under conditions of a high temperature on the cutting edge can be provided.

(2) According to the (1), in the first unit layer and the second unit layer adjacent to the first unit layer, a ratio $\lambda2/\lambda1$ of a thickness $\lambda2$ μm of the second unit layer to a thickness $\lambda1$ μm of the first unit layer may be 1.0 or more and 5.0 or less. According to this, the cutting tool can have a longer tool lifetime.

(3) According to the (1) or (2),
an average thickness of the first unit layer may be 0.002 μm or more and 0.2 μm or less, and
an average thickness of the second unit layer may be 0.002 μm or more and 0.2 μm or less.

According to this, the cutting tool can have a longer tool lifetime.

(4) According to any of the (1) to (3),
the coating may further include a second layer disposed between the base and the first layer, and
a composition of the second layer may be same as a composition of the first unit layer or a composition of the second unit layer.

According to this, the cutting tool can have a longer tool lifetime.

(5) According to the (4),
the composition of the second layer may be same as the composition of the first unit layer, and
a thickness of the second layer may be larger than a thickness of the first unit layer.

According to this, the cutting tool can have a longer tool lifetime.

(6) According to the (4),
the composition of the second layer may be same as the composition of the second unit layer, and
a thickness of the second layer may be larger than a thickness of the second unit layer.

According to this, the cutting tool can have a longer tool lifetime.

(7) According to any of the (1) to (6),
the coating may further include a third layer provided on a side opposite to the base of the first layer, and
the third layer may be composed of TiSiCN.

According to this, the cutting tool can have a longer tool lifetime.

(8) A cutting tool according to another aspect of the present disclosure is a cutting tool comprising:
a base; and
a coating disposed on the base, wherein
the coating includes a first A layer,
the first A layer is composed of an alternate layer in which a first unit layer and a third unit layer are alternately stacked,
the first unit layer has a hexagonal crystal structure,
the first unit layer is composed of $W(C_{1-a}Na)_x$,
a represents 0.3 or more and 0.8 or less,
x represents 0.8 or more and 1.2 or less,
the third unit layer is composed of $Ti_dSi_{1-d-e}MN$,
M represents boron, yttrium, cerium, or lanthanum,
d represents 0.80 or more and 0.99 or less, and
e represents more than 0 and 0.05 or less.

According to the present disclosure, the cutting tool that has a long tool lifetime even in cutting processing performed particularly under conditions of a high temperature on the cutting edge can be provided.

(9) According to the (8), in the first unit layer and the third unit layer adjacent to the first unit layer, a ratio $\lambda3/\lambda1$ of a thickness $\lambda3$ μm of the third unit layer to a thickness $\lambda1$ μm of the first unit layer may be 1.0 or more and 5.0 or less.

According to this, the cutting tool can have a longer tool lifetime.

(10) According to the (8) or (9), M may represent silicon.
According to this, the cutting tool can have a longer tool lifetime.

(11) According to the (8) or (9), M may represent boron.
According to this, the cutting tool can have a longer tool lifetime.

(12) According to any of the (8) to (11),
an average thickness of the first unit layer may be 0.002 μm or more and 0.2 μm or less, and
an average thickness of the third unit layer may be 0.002 μm or more and 0.2 μm or less.

According to this, the cutting tool can have a longer tool lifetime.

(13) According to any of the (8) to (12),
the coating may further include a second A layer disposed between the base and the first A layer, and
a composition of the second A layer may be same as a composition of the first unit layer or a composition of the third unit layer.

According to this, the cutting tool can have a longer tool lifetime.

(14) According to the (13),
the composition of the second A layer may be same as the composition of the first unit layer, and
a thickness of the second A layer may be larger than a thickness of the first unit layer.

According to this, the cutting tool can have a longer tool lifetime.

(15) According to the (13),
the composition of the second A layer may be same as the composition of the third unit layer, and
a thickness of the second A layer may be larger than a thickness of the third unit layer.

According to this, the cutting tool can have a longer tool lifetime.

(16) According to any of the (8) to (15),
the coating may further include a third A layer provided on a side opposite to the base of the first A layer,
the third A layer may be composed of TiSiMeCN, and
Me may represent boron, yttrium, cerium, or lanthanum.

According to this, the cutting tool can have a longer tool lifetime.

DETAILED DESCRIPTION OF EMBODIMENTS

With reference to the drawings, specific examples of the cutting tool of the present disclosure will be described hereinafter. In the drawings of the present disclosure, a same reference sign represents same parts or corresponding parts. Dimensions such as length, width, thickness, and depth are appropriately modified to clarify and simplify the drawings, and do not always represent actual dimensions.

A description in the form of "A to B" herein means an upper and lower limits of a range (that is, A or more and B or less). When A has no description of a unit and only B has a description of a unit, the unit of A and the unit of B are same.

When a compound and the like are represented by a chemical formula herein, any conventionally known atomic ratios are included unless the atomic ratio is particularly limited, and should not be necessarily limited to an atomic ratio within a stoichiometric range.

When one or more values are each described herein as lower limits of numerical ranges and upper limits of numerical ranges, combinations of any one value described as the lower limit and any one value described as the upper limit are also disclosed. For example, when a1 or more, b1 or more, and c1 or more are described as lower limits and a2 or less, b2 or less, and c2 or less are described as upper limits, disclosed are a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less.

Embodiment 1: Cutting Tool (1)

The cutting tool according to an embodiment of the present disclosure will be described by using FIG. 1 to FIG. 5.

A cutting tool 1 according to an embodiment of the present disclosure (hereinafter, also referred to as "Embodiment 1") is a cutting tool comprising:
 a base 2; and
 a coating 3 disposed on base 2, wherein
 coating 3 includes a first layer 13,
 first layer 13 is composed of an alternate layer in which first unit layer 12 and second unit layer 15 are alternately stacked,
 first unit layer 12 has a hexagonal crystal structure,
 first unit layer 12 is composed of $W(C_{1-a}Na)_x$,
 a represents 0.3 or more and 0.8 or less,
 x represents 0.8 or more and 1.2 or less,
 second unit layer 15 is composed of $Ti_cSi_{1-c}N$, and
 c represents 0.80 or more and 0.99 or less.

Cutting tool 1 of Embodiment 1 can have a long tool lifetime even in cutting processing performed particularly under conditions of a high temperature on the cutting edge. The reason is presumed as follows.

First unit layer 12 is composed of $W(C_{1-a}Na)_x$. Since first unit layer 12 contains C (carbon), a frictional coefficient on a contacting interface with workpiece can be reduced to reduce cutting resistance. In addition, since $W(C_{1-a}Na)_x$ contains N (nitrogen), the heat resistance is improved by approximately 150° C. compared with WC. As a result, the first layer that includes the first unit layer can improve agglutination resistance, a sliding property, and wear resistance in process in which the cutting edge becomes hot, such as dry cutting processing. Thus, the cutting tool that includes the first layer has an improved tool lifetime.

Second unit layer 15 is composed of $Ti_cSi_{1-c}N$ ("c" represents 0.80 or more and 0.99 or less). Second unit layer 15 has a so-called nanocomposite structure in which nanometer-sized cubic TiN crystals and amorphous $SiN_x$ are mixed. Since having extremely increased hardness, second unit layer 15 has an excellent balance between wear resistance, heat shielding property, oxidation resistance, and toughness. Thus, the cutting tool that includes second unit layer 15 has an improved tool lifetime.

First layer 13 is composed of the alternate layer in which first unit layer 12 and second unit layer 15 are alternately stacked. On an interface between first unit layer 12 and second unit layer 15, the compositions and the crystal lattices are discontinuous. Thus, when cracking occurs from a surface of coating 3 during cutting, the interface can inhibit development of the cracking. The coating that includes the first layer inhibits chipping and breakage. Thus, the cutting tool that includes first layer 13 has an improved tool lifetime.

<Cutting Tool>

Figure 2:
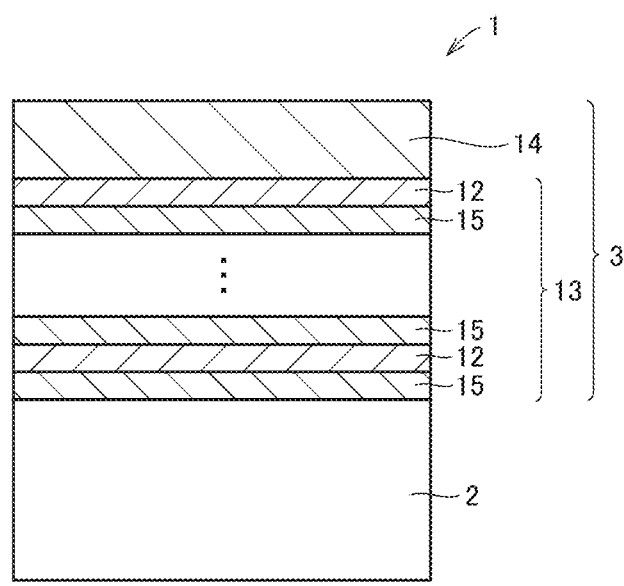
FIG. 2 is a schematic enlarged cross-sectional view of another example of a cutting tool according to Embodiment 1.

As illustrated in FIG. 1 and FIG. 2, cutting tool 1 according to an embodiment of the present invention comprises: base 2; and coating 3 disposed on coating 2. Coating 3 can cover at least a part involved in cutting in base 2. Coating 3 may cover an entire surface of base 2. The constitution of coating 3 that partially differs does not depart from the scope of the present embodiment. The part involved in cutting in base 2 herein means a region where a distance from a cutting edge ridgeline is at least within 50 μm, within 100 μm, or within 300 μm on a surface of base 2.

Cutting tool 1 of the present embodiment can be suitably used as cutting tool 1 such as a drill, an endmill, an indexable cutting insert for a drill, an indexable cutting insert for an endmill, an indexable cutting insert for milling, an indexable cutting insert for turning, a metal saw, a gear-cutting tool, a reamer, and a tap.

<Base>

As base 2, any conventionally known bases may be used. For example, base 2 may be composed of any of cemented carbide (such as WC-based cemented carbide, cemented carbide that contains WC and Co, cemented carbide in which a carbonitride of Ti, Ta, Nb, or the like is added into WC and Co), cermet (that contains TiC, TiN, TiCN, or the like as a main component), high-speed steel, ceramics (such as titanium carbide, silicon carbide, silicon nitride, aluminum nitride, and aluminum oxide), a cubic boron nitride sintered material, or a diamond sintered material.

Base 2 may be particularly a WC-based cemented carbide or cermet (particularly, TiCN-based cermet). Since having particularly excellent balance between hardness and strength at high temperature, the WC-based cemented carbide or the cermet can contribute to lengthening of the lifetime of cutting tool 1 when used as base 2 of cutting tool 1.

<Coating>

Coating 3 of Embodiment 1 includes first layer 13. Coating 3 has an effect of improving properties of cutting tool 1 such as wear resistance and chipping resistance to lengthen the lifetime of cutting tool 1 by covering base 2.

Figure 3:
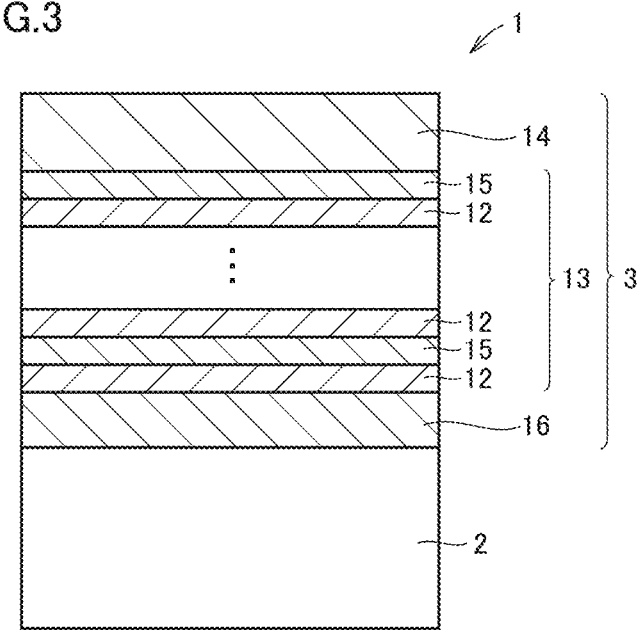
FIG. 3 is a schematic enlarged cross-sectional view of another example of a cutting tool according to Embodiment 1.
Figure 4:
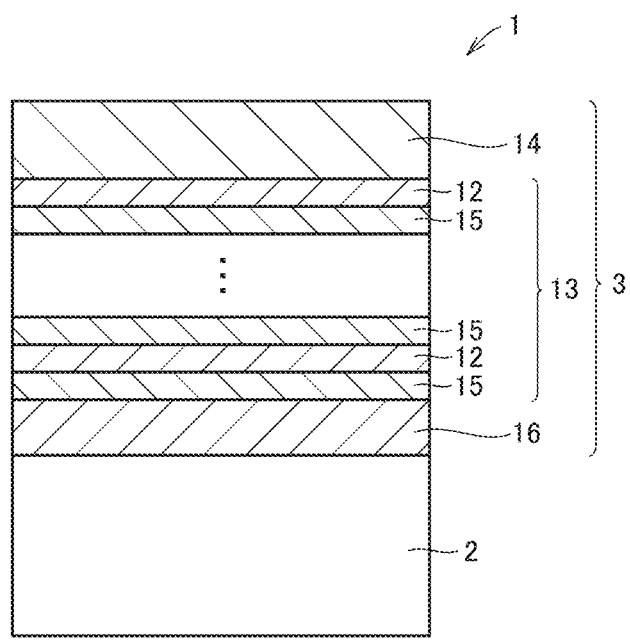
FIG. 4 is a schematic enlarged cross-sectional view of another example of a cutting tool according to Embodiment 1.

Coating 3 may include another layer in addition to first layer 13. Examples of the other layer include: a second layer 16 disposed between base 2 and first layer 13; and a third layer 14 provided on a side opposite to base 2 of first layer 13, as illustrated in FIG. 3 and FIG. 4.

Coating 3 may have an entire thickness of 0.4 μm or more and 15 μm or less. When the entire thickness of coating 3 is 0.4 μm or more, the effect of lengthening the lifetime of cutting tool 1 by providing coating 3 is easily obtained. Meanwhile, when the entire thickness of coating 3 is 15 μm or less, chipping on coating 3 in initial cutting hardly occurs, and the lifetime of cutting tool 1 can be lengthened.

The entire thickness of coating 3 can be measured by observing a cross section of coating 3 by using a scanning electron microscope (SEM). A specific measurement method is as follows. Cutting tool 1 is cut in a direction along a normal line of the surface of coating 3 to prepare a cross-sectional sample. The cross-sectional sample is observed with an SEM. The observation magnification is 5,000 to 10,000, and the measurement field is 100 to 500 µm². Thickness widths of coating 3 are measured at three positions in one field, and an average value of the thickness widths at the three positions is calculated. The average value corresponds to the thickness of coating 3. A thickness of each layer described later is measured in the same manner unless otherwise specified.

A compressive residual stress of coating 3 may be 6 GPa or less in an absolute value. The compressive residual stress of coating 3 is a kind of internal stress (specific strain) present in an entirety of coating 3, and refers to a stress represented by a "−" (negative) value (unit: "GPa" is used in the present embodiment). Thus, a concept of a large compressive residual stress represents a large absolute value of the value, and a concept of a small compressive residual stress represents a small absolute value of the value. That is, the absolute vale of the compressive residual stress of 6 GPa or less means that the compressive residual stress of coating 3 is −6 GPa or more and 0 GPa or less.

When the compressive residual stress of coating 3 is 0 GPa or less, development of cracking generated from the outermost surface of coating 3 is easily inhibited. Meanwhile, when the absolute value of the compressive residual stress is 6 GPa or less, a value of the stress is appropriate, and peeling of coating 3 from the edge part of cutting tool 1 before beginning of cutting is easily inhibited.

The compressive residual stress of coating 3 is measured by a $\sin^2 \psi$ method using an X-ray residual stress apparatus (see "X-Ray Stress Measurement" (The Society of Materials Science, Japan, published in 1981 by Yokendo Ltd. Publishers) pp. 54 to 66).

First unit layer 12 may have a hexagonal crystal structure. When first unit layer 12 has a hexagonal crystal structure, wear resistance of coating 3 is improved. Second unit layer 15 may contain a cubic crystal structure. When second unit layer 15 has a cubic crystal structure, hardness of coating 3 is improved. The crystal structure of each layer in coating 3 can be analyzed with an X-ray diffraction apparatus known in the field.

The hardness of coating 3 yields a large effect at 30 GPa or more and 55 GPa or less, and the hardness may be 35 GPa or more and 50 GPa or less. According to this, coating 3 has sufficient hardness. The hardness of an entirety of coating 3 is measured by a nano-indenter method (Nano Indenter XP, manufactured by MTS Systems Corporation). Specifically, the measurement is performed by a method in accordance with ISO14577, the measurement load is 10 mN (1 gf), hardness on the surface of coating 3 is measured at three positions, and an average value of the hardness at the three positions is calculated. The average value corresponds to the hardness of coating 3.

<First Layer>

First layer 13 of the present embodiment is composed of the alternate layer in which first unit layer 12 and second unit layer 15 are alternately stacked. First layer 13 composed of the alternate layer in which first unit layer 12 and second unit layer 15 are alternately stacked can be confirmed by difference in contrast by observing a flake sample that contains a cross section of coating 3 with a transmission electron microscope (TEM).

Any of first unit layer 12 and second unit layer 15 may be disposed at a position closest to the side of base 2. In FIG. 1, first unit layer 12 is disposed directly on base 2. In FIG. 2, second unit layer 15 is disposed directly on base 2. Any of first unit layer 12 and second unit layer 15 may be disposed on the surface side of coating 3. In FIG. 1, second unit layer 15 is disposed on the surface side of coating 3. In FIG. 2, first unit layer 12 is disposed on the surface side of coating 3.

A thickness of first layer 13 may be 0.5 µm or more and 15 µm or less. When the thickness of first layer 13 is 0.5 µm or more, excellent wear resistance can be exhibited in continuous processing. When the thickness of first layer 13 is 15 µm or less, the cutting tool can have excellent chipping resistance in intermittent cutting.

The thickness of first layer 13 is measured by observing the cross section of coating 3 using a transmission electron microscope (TEM). A specific measurement method is as follows. Cutting tool 1 is cut in a direction along a normal line of the surface of coating 3 to prepare a flake sample that contains the cross section of coating 3. The flake sample is observed with a TEM. The observation magnification is 20,000 to 5,000,000, and the measurement field is 0.0016 to 80 µm². Thickness widths of first layer 13 are measured at three positions in one field, and an average value of the thickness widths at the three positions is calculated. The average value corresponds to the thickness of first layer 13.

First unit layer 12 may have a hexagonal crystal structure. The hexagonal crystal structure is derived from $W(C_{1-a}Na)_x$ that constitutes first unit layer 12. First unit layer 12 that has the hexagonal crystal structure can be confirmed by analysis with XRD measurement. When a peak attributed to a hexagonal crystal type defined in $E-W_2C$ (01-076-7103) and $W_{4.6}N_4$ (01-077-2001) in JCPDS (ICDD) card is observed in the obtained XRD spectrum, first unit layer 12 is confirmed to have the hexagonal crystal structure.

When the coating includes other layers such as second unit layer 15, second layer 16, third layer 14, and an intermediate layer in addition to the first unit layer, and peaks derived from the layer other than first unit layer 12 and the base (hereinafter, also referred to as "other peaks") are detected in the XRD spectrum from the surface of coating 3, first unit layer 12 can also be identified to have the hexagonal crystal structure.

Examples of the apparatus used for the X-ray diffraction measurement include "SmartLab" (trade name), manufactured by Rigaku Corporation. The conditions of the XRD measurement are as follows.

(XRD Measurement Conditions)
Scanning axis: 2θ-θ
X-ray source: Cu-Kα radiation (1.541862 Å)
Detector: 0-dimensional detector (scintillation counter)
Tube voltage: 45 kV
Tube current: 40 mA
Incident optics: utilizing mirror
Receiving light optics: utilizing analyzer crystal (PW3098/27)
Step: 0.03°
Scanning time: 2 seconds
Scanning range (2θ): 100 to 1200

<Composition of First Unit Layer and Composition of Second Unit Layer>

First unit layer 12 is composed of $W(C_{1-a}Na)_x$, wherein "a" represents 0.3 or more and 0.8 or less, and "x" represents 0.8 or more and 1.2 or less. According to this, the crystal structure of first unit layer 12 becomes hexagonal, and heat resistance, oxidation resistance, and wear resistance of first unit layer 12 can be improved.

A lower limit of "a" is 0.3 or more, may be 0.35 or more, may be 0.40 or more, or may be 0.45 or more. An upper limit of "a" is 0.8 or less, may be 0.75 or less, may be 0.70 or less, or may be 0.65 or less. "a" may be 0.35 or more and 0.75 or less, may be 0.40 or more and 0.70 or less, or may be 0.45 or more and 0.65 or less.

A lower limit of "x" is 0.8 or more, may be 0.85 or more, or may be 0.90 or more. An upper limit of "x" is 1.2 or less, may be 1.15 or less, or may be 1.10 or less. "x" may be 0.85 or more and 1.15 or less, may be 0.90 or more and 1.10 or less, or may be 1.00.

The term "the first unit layer is composed of $W(C_{1-a}Na)_x$," herein means that first unit layer 12 may contain an inevitable impurity in addition to $W(C_{1-a}Na)_x$ as long as the effect of the present disclosure is not impaired. Examples of the inevitable impurity include oxygen and carbon. A content rate of an entirety of the inevitable impurity in first unit layer 12 may be larger than 0 atom % and less than 1 atom %. The term "atom %" herein means a proportion (%) of the number of atoms relative to a total number of atoms to constitute the layer.

Second unit layer 15 is composed of $Ti_cSi_{1-c}N$, and "c" represents 0.80 or more and 0.99 or less. Second unit layer 15 can improve heat shielding property, oxidation resistance, and toughness of coating 3. A lower limit of "c" is 0.80 or more, may be 0.81 or more, may be 0.82 or more, may be 0.85 or more, or may be 0.88 or more. An upper limit of "c" is 0.99 or less, may be 0.95 or less, may be 0.93 or less, or may be 0.90 or less. "c" may be 0.81 or more, may be 0.82 or more and 0.95 or less, may be 0.85 or more and 0.93 or less, or may be 0.88 or more and 0.90 or less.

The term "the second unit layer is composed of $Ti_cSi_{1-c}N$" herein means that second unit layer 15 may contain an inevitable impurity in addition to $Ti_cSi_{1-c}N$ as long as the effect of the present disclosure is not impaired. Examples of the inevitable impurity include oxygen and carbon. A content rate of an entirety of the inevitable impurity in second unit layer 15 may be larger than 0 atom % and less than 1 atom %.

The "a", the "x", the "c", the content rate of the inevitable impurity in first unit layer 12, and the content rate of the inevitable impurity in second unit layer 15 are measured by elemental analysis on the cross section of coating 3 using a transmission electron microscope (TEM). A specific measurement method is as follows. Cutting tool 1 is cut in a direction along a normal line of the surface of coating 3 to prepare a flake sample that contains the cross section of coating 3. The flake sample is irradiated with electron beam by using energy dispersive X-ray spectroscopy (EDS) attached to the TEM, and energy and generation time of characteristic X-ray generated in this time are measured to perform elemental analysis on first unit layer 12 and second unit layer 15. Five first unit layers 12 and five second unit layers 15 are randomly selected to perform the elemental analysis. An average composition of the five first unit layers 12 is determined. This average composition corresponds to the composition of first unit layer 12. An average composition of the five second unit layers 15 is determined. This average composition corresponds to the composition of second unit layer 15. When the numbers of layers of first unit layers 12 and second unit layers 15 are each four or less, the elemental analysis is performed on all the layers to determine average compositions of first unit layers 12 and second unit layers 15. As long as an identical cutting tool 1 is measured, it has been confirmed that the measurement results have no variation even by randomly selecting the measurement positions.

In the present disclosure, in the composition $W(C_{1-a}Na)_x$ of the first unit layer, a ratio $A_{N1}/A_{M1}$ of a total number $A_{N1}$ of atoms of C and N relative to a number $A_{M1}$ of atoms of W is 0.8 or more and 1.2 or less. In the present disclosure, in the composition $Ti_cSi_{1-c}N$ of the second unit layer, a ratio $A_{N2}/A_{M2}$ of a number $A_{N2}$ of atoms of N relative to a total number $A_{M2}$ of atoms of Ti and Si is necessarily 0.8 or more and 1.2 or less in manufacturing. The ratio $A_{N1}/A_{M1}$ and the ratio $A_{N2}/A_{M2}$ can be measured by a Rutherford backscattering (RBS) method. When the ratio $A_{N1}/A_{M1}$ and the ratio $A_{N2}/A_{M2}$ are within the above ranges, it has been confirmed that the effect of the present disclosure is not impaired.

<Average Thickness of First Unit Layers and Average Thickness of Second Unit Layers>

An average thickness of first unit layers 12 may be 0.002 μm or more and 0.2 μm or less, and an average thickness of second unit layers 15 may be 0.002 μm or more and 0.2 μm or less. According to this, development of cracking generated on the surface of coating 3 can be further inhibited. A lower limit of the average thickness of first unit layers 12 may be 0.002 μm or more, may be 0.005 μm or more, or may be 0.01 μm or more. An upper limit of the average thickness of first unit layers 12 may be 0.20 μm or less, may be 0.15 μm or less, or may be 0.10 μm or less. The average thickness of first unit layers 12 may be 0.005 μm or more and 0.15 μm or less, or may be 0.01 μm or more and 0.1 μm or less. A lower limit of the average thickness of second unit layers 15 may be 0.002 μm or more, may be 0.005 μm or more, or may be 0.01 μm or more. An upper limit of the average thickness of second unit layers 15 may be 0.20 μm or less, may be 0.15 μm or less, or may be 0.10 μm or less. The average thickness of second unit layers 15 may be 0.005 μm or more and 0.15 μm or less, or may be 0.01 μm or more and 0.10 μm or less.

The average thickness of first unit layers 12 and the average thickness of second unit layers 15 can be measured by the method same as the measurement method of the thickness of first layer 13.

Figure 5:
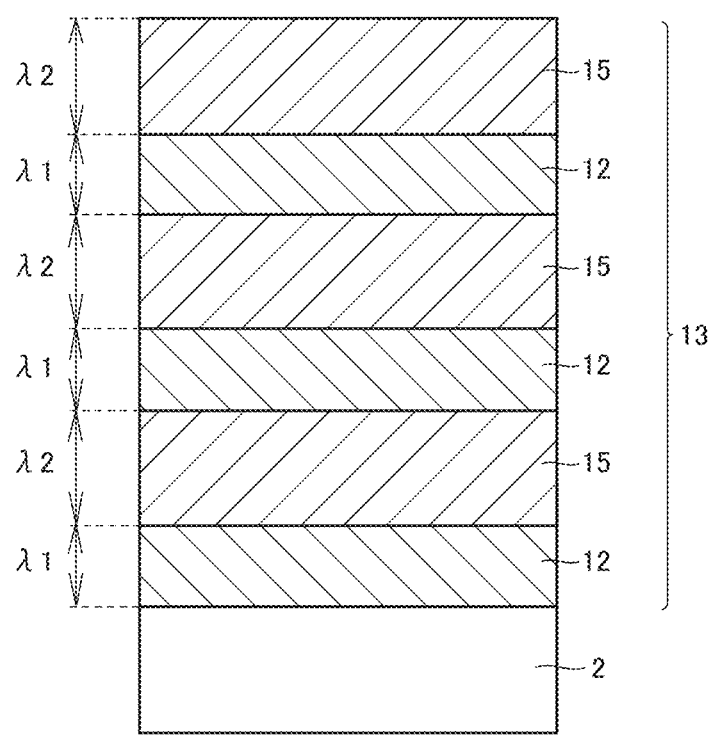
FIG. 5 is a view for describing an example of a ratio between thicknesses of a first unit layer and second unit layer.
Figure 6:
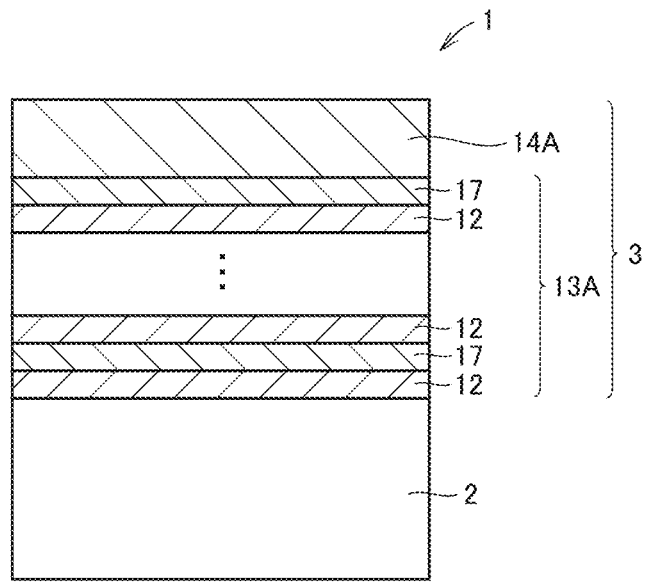
FIG. 6 is a schematic enlarged cross-sectional view of an example of a cutting tool according to Embodiment 2.
Figure 7:
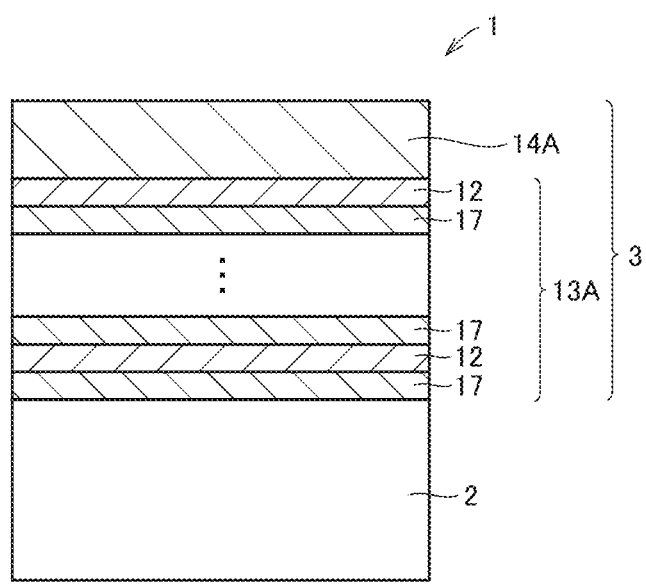
FIG. 7 is a schematic enlarged cross-sectional view of another example of a cutting tool according to Embodiment 2.

As illustrated in FIG. 5, in first unit layer 12 and second unit layer 15 adjacent to first unit layer 12, a ratio $\lambda2/\lambda1$ of a thickness $\lambda2$ μm of second unit layer 15 to a thickness $\lambda1$ μm of first unit layer 12 may be 1.0 or more and 5.0 or less. Second unit layer 15 has high oxidation resistance, and in addition, low thermal conductivity and has a property of hardly conducting heat generated during cutting toward base 2. When the ratio $\lambda2/\lambda1$ is 1.0 or more, a proportion of second unit layer 15 in coating 3 relatively increases, resulting in improvement of a heat shielding property as an entirety of cutting tool 1. Cutting tool 1 that has coating 3 has particularly improved wear resistance in continuous cutting. When $\lambda2/\lambda1$ is 1.0 or more, toughness of coating 3 tends to be improved. Meanwhile, when $\lambda2/\lambda1$ is 5.0 or less, the effect of inhibiting development of cracking by stacking first unit layer 12 and second unit layer 15 tends to be easily obtained.

$\lambda2/\lambda1$ may be 1.0 or more, may be 1.1 or more, may be 1.2 or more, may be 1.3 or more, may be 1.4 or more, may be 1.5 or more, may be 2.0 or more, or may be 2.5 or more. $\lambda2/\lambda1$ may be 5.0 or less, may be 4.0 or less, or may be 3.0 or less. $\lambda2/\lambda1$ may be 1.2 or more and 4.0 or less, or may be 1.5 or more and 2.5 or less. Although all thicknesses of three first unit layers 12 are represented as $\lambda1$ and all thicknesses of three second unit layers 15 are represented as $\lambda2$ in FIG. 5 for description, the thicknesses $\lambda1$ of three first unit layers 12 are not needed to be equal, and the thicknesses $\lambda2$ of three second unit layers 15 are not needed to be equal as long as the above relationship of λ2/λ1 is satisfied between the first unit layer and the second unit layer adjacent to each other.

In first layer 13, the number of stacking of each of first unit layers 12 and second unit layers 15 may be 5 or more and 500 or less, or may be 10 or more and 500 or less. According to this, stacking of first unit layers 12 and second unit layers 15 can sufficiently yield an effect of improving the hardness and the compressive residual stress with good balance. In first layer 13, the number of stacking of each of first unit layers 12 and second unit layers 15 may be 100 or more and 400 or less, or may be 200 or more and 350 or less.

In first layer 13, the number of stacking of each of first unit layers 12 and second unit layers 15 can be determined by observing the flake sample of the cross section of coating 3 using a transmission electron microscope (TEM) with an observation magnification of 20,000 to 5,000,000.

<Second Layer>

As illustrated in FIG. 3 and FIG. 4, coating 3 may further include a second layer 16 disposed between base 2 and first layer 13, and a composition of second layer 16 may be same as a composition of first unit layer 12 or a composition of second unit layer 15. According to this, adhesiveness between base 2 and coating 3 can be improved.

When the composition of second layer 16 is same as the composition of first unit layer 12, second layer 16 has a good sliding property even when second layer 16 is exposed in initial cutting, and thereby wear resistance can be improved.

When the composition of second layer 16 is same as the composition of first unit layer 12, a thickness of second layer 16 may be larger than the thickness of first unit layer 12. According to this, adhesiveness between base 2 and coating 3 can be further increased. Since second layer 16 has a good sliding property even when second layer 16 is exposed in initial cutting, wear resistance can be improved. The term "the thickness of the second layer is larger than the thickness of the first unit layer" can be rephrased to "the thickness of the second layer is more than 1.0 time larger than the thickness of the first unit layer". The thickness of second layer 16 may be 2.0 times or more, may be 4.0 times or more, or may be 10.0 times or more larger than the thickness of first unit layer 12. The thickness of second layer 16 may be 500 times or less, may be 120 times or less, or may be 50 times or less larger than the thickness of first unit layer 12. The thickness of second layer 16 may be 2.0 times or more and 500 times or less, may be 4.0 times or more and 120 times or less, or may be 10.0 times or more and 50 times or less larger than the thickness of first unit layer 12.

When the composition of second layer 16 is same as the composition of first unit layer 12, the thickness of second layer 16 may be 0.1 μm or more. If the thickness of second layer 16 is less than 0.1 μm, the effect of improving wear resistance by setting second layer 16 to have the same composition as first unit layer 12 tends to be difficult to obtain. When the composition of second layer 16 is same as the composition of first unit layer 12, the thickness of second layer 16 may be 0.3 μm or more, or may be 0.4 μm or more. An upper limit value of the thickness of second layer 16 is not particularly limited, but more than 2 μm enlarges the crystal grains to generate a grain boundary, which tends to be difficult to obtain the effect of improving wear resistance. Thus, with considering a cost aspect, the thickness of second layer 16 may be 2 μm or less.

When the composition of second layer 16 is same as the composition of first unit layer 12, first unit layer 12 may be stacked directly on second layer 16, as illustrated in FIG. 3. As illustrated in FIG. 4, second unit layer 15 may also be stacked directly on second layer 16. When the composition of second layer 16 is same as the composition of first unit layer 12 and first unit layer 12 is stacked directly on second layer 16, second layer 16 and first unit layer 12 have a continuous crystal structure.

When the composition of second layer 16 is same as the composition of second unit layer 15, the thickness of second layer 16 may be larger than the thickness of second unit layer 15. According to this, adhesiveness between base 2 and coating 3 can be further increased. In addition, even when second layer 16 is exposed in initial cutting, oxidation from the interface between base 2 and coating 3 can be inhibited and the cutting heat can be shielded. The term "the thickness of the second layer is larger than the thickness of the second unit layer" can be rephrased to "the thickness of the second layer is more than 1.0 time larger than the thickness of the second unit layer". The thickness of second layer 16 may be 2.0 times or more, may be 4.0 times or more, or may be 10.0 times or more larger than the thickness of second unit layer 15. The thickness of second layer 16 may be 500 times or less, may be 120 times or less, or may be 50 times or less larger than the thickness of second unit layer 15. The thickness of second layer 16 may be 2.0 times or more and 500 times or less, may be 4.0 times or more and 120 times or less, or may be 10.0 times or more and 50 times or less larger than the thickness of second unit layer 15.

When the composition of second layer 16 is same as the composition of second unit layer 15, the thickness of second layer 16 may be 0.1 μm or more. If the thickness of second layer 16 is less than 0.1 μm, the effect of inhibiting the oxidation from the interface between base 2 and coating 3 and the effect of shielding the cutting heat by setting second layer 16 to have the same composition as second unit layer 15 tend to be difficult to obtain. When the composition of second layer 16 is same as the composition of second unit layer 15, the thickness of second layer 16 may be 0.3 μm or more, or may be 0.4 μm or more. An upper limit value of the thickness of second layer 16 is not particularly limited, but more than 2 μm enlarges the crystal grains to generate a grain boundary, which tends to be difficult to further improve the effect of inhibiting the oxidation. Thus, with considering a cost aspect, the thickness of second layer 16 may be 2 μm or less.

When the composition of second layer 16 is same as the composition of second unit layer 15, first unit layer 12 may be stacked directly on second layer 16, as illustrated in FIG. 3. As illustrated in FIG. 4, second unit layer 15 may also be stacked directly on second layer 16. When the composition of second layer 16 is same as the composition of second unit layer 15 and second unit layer 15 is stacked directly on second layer 16, second layer 16 and second unit layer 15 have a continuous crystal structure.

<Third Layer>

As illustrated in FIG. 1 to FIG. 4, coating 3 may further include a third layer 14 provided on a side opposite to base 2 of first layer 13, and third layer 14 may be composed of TiSiCN. According to this, a frictional coefficient of coating 3 can be reduced to attempt to lengthen the lifetime of cutting tool 1.

A carbonitride typically tends to have a lower frictional coefficient against workpiece than a nitride. Such lowering of the frictional coefficient is presumably derived from contribution of the carbon atoms. Coating 3 that includes third layer 14 lowers the frictional coefficient of coating 3 against the workpiece to lengthen the lifetime of cutting tool 1.

In third layer 14, regulating a composition ratio between N and C enables to impart a predetermined color. According to this, design properties and distinctive properties can be imparted to appearance of cutting tool 1, which yields commercial usefulness.

A thickness of third layer 14 may be 0.1 μm or more. When the thickness of third layer 14 is 0.1 μm or more, an effect of imparting lubricity by third layer 14 is easily obtained. Meanwhile, an upper limit value of the thickness of third layer 14 is not particularly limited, but more than 2 μm tends to fail to further improve the aforementioned effect of imparting lubricity. Thus, the thickness of third layer 14 may be 2 μm or less with considering a cost aspect.

<Intermediate Layer>

Coating 3 may include an intermediate layer disposed between second layer 16 and first layer 13, or between first layer 13 and third layer 14. Examples of the intermediate layer include TiSiCeN, TiSiN, TiSiBN, TiSiYN, and TiSi-LaN. A thickness of the intermediate layer may be 0.1 μm or more and 2 μm or less, may be 0.3 μm or more and 1.5 μm or less, or may be 0.4 μm or more and 1.0 μm or less.

Embodiment 2: Cutting Tool (2)

A cutting tool according to another embodiment of the present disclosure will be described by using FIG. 6 to FIG. 10.

A cutting tool 1 according to another embodiment (hereinafter, also referred to as "Embodiment 2") of the present disclosure is cutting tool 1 comprising:
 abase 2; and
 a coating 3 disposed on base 2, wherein
 coating 3 includes a first A layer 13A,
 first A layer 13A is composed of an alternate layer in which first unit layer 12 and third unit layer 17 are alternately stacked,
 the first unit layer has a hexagonal crystal structure,
 first unit layer 12 is composed of $W(C_{1-a}Na)_x$,
 a represents 0.3 or more and 0.8 or less,
 x represents 0.8 or more and 1.2 or less,
 third unit layer 17 is composed of $Ti_dSi_{1-d-e}M_eN$,
 M represents boron, yttrium, cerium, or lanthanum,
 d represents 0.80 or more and 0.99 or less, and
 e represents more than 0 and 0.05 or less.

Cutting tool 1 of Embodiment 2 can have a long tool lifetime even in cutting processing performed particularly under conditions of a high temperature on the cutting edge. The reason is presumed as follows.

First unit layer 12 is composed of $W(C_{1-a}Na)_x$. Since first unit layer 12 contains C (carbon), a frictional coefficient on a contacting interface with workpiece can be reduced to reduce cutting resistance. In addition, since $W(C_{1-a}Na)_x$ contains N (nitrogen), the heat resistance is improved by approximately 150° C. compared with WC. As a result, the first layer that includes the first unit layer can improve wear resistance in process in which the cutting edge becomes hot, such as dry cutting processing. Thus, the cutting tool that includes the first layer has an improved tool lifetime.

With comparing: a layer composed of a nitride of Ti and Si (also referred to as "TiSiN layer"); and a layer composed of a nitride that contains Ti, Si, and M (M represents boron, yttrium, cerium, or lanthanum) (also referred to as "TiSiMN layer"), the TiSiMN layer has small compressive residual stress and characteristics of a high heat shielding property. Since composed of the alternate layer in which first unit layer 12 composed of the WCN layer and third unit layer 17 composed of the TiSiMN layer are alternately stacked, first A layer 13A can have the characteristics of first unit layer 12, which are high hardness and low friction, and the characteristics of third unit layer 17, which are a high heat shielding property. The characteristics of the small compressive residual stress of third unit layer 17 can be compensated by the large compressive residual stress of first unit layer 12. Therefore, the hardness, the heat shielding property, and the compressive residual stress are improved with good balance as an entirety of first A layer 13A, and the lifetime of cutting tool 1 that includes first A layer 13A is further lengthened.

Third unit layer 17 has a so-called nanocomposite structure in which nanometer-sized cubic TiN crystals and amorphous SiNx are mixed. Since having extremely increased hardness, third unit layer 17 has an excellent balance between wear resistance, heat shielding, oxidation resistance, and toughness. Thus, the cutting tool that includes third unit layer 17 can achieve a long tool lifetime.

First A layer 13A is composed of the alternate layer in which first unit layer 12 and third unit layer 17 are alternately stacked. On an interface between first unit layer 12 and third unit layer 17, the compositions and the crystal lattices are discontinuous. Thus, when cracking occurs from a surface of coating 3 during cutting, the interface can inhibit development of the cracking. Therefore, chipping and breakage are inhibited to further lengthen the lifetime of cutting tool 1.

Cutting tool 1 of Embodiment 2 may have basically same constitution as cutting tool 1 of Embodiment 1 except for constitution of first A layer 13A, second A layer 16A, and third A layer 14A. Hereinafter, "first A layer", "second A layer", and "third A layer" will be described.

<First A Layer>

First A layer 13A of the present embodiment is composed of the alternate layer in which first unit layer 12 and third unit layer 17 are alternately stacked. First A layer 13A composed of the alternate layer in which first unit layer 12 and third unit layer 17 are alternately stacked can be confirmed by difference in contrast by observing a cross section of coating 3 with a transmission electron microscope (TEM). A thickness of first A layer 13A may have same constitution as the thickness of first layer 13 described in Embodiment 1.

<Composition of First Unit Layer and Composition of Third Unit Layer>

The composition $W(C_{1-a}Na)_x$ of first unit layer 12 of Embodiment 2 may be same as the composition $W(C_{1-a}Na)_x$ of first unit layer 12 of Embodiment 1.

Third unit layer 17 is composed of $Ti_dSi_{1-d-e}M_eN$, wherein M represents boron, yttrium, cerium, or lanthanum, "d" represents 0.80 or more and 0.99 or less, and "e" represents more than 0 and 0.05 or less. Third unit layer 17 can have both of excellent hardness and excellent oxidation resistance. The reason is presumed as follows.

When M represents boron, boron increases hardness of third unit layer 17 to increase hardness of an entirety of coating 3. An oxide of boron formed by oxidation on the surface of cutting tool 1 in cutting densifies an oxide of Al in third unit layer 17 to improve oxidation resistance of third unit layer 17. Furthermore, since having a low melting point, the oxide of boron serves as a lubricant during cutting, and can inhibit agglutination of workpiece.

When M represents yttrium (Y), cerium (Ce), or lanthanum (La), a lattice constant of YN is 4.88 Å, a lattice constant of CeN is 5.01 Å, and a lattice constant of LaN is 5.30 Å. The lattice constants of YN, CeN, and LaN are larger than a lattice constant of TiN, 4.23 Å. Thus, in third unit layer 17 composed of $Ti_dSi_{1-d-e}M_eN$ in which Y, Ce, or La is added to have cubic crystals, strain is introduced and structure becomes fine, hardness and wear resistance of third unit layer 17 are improved to further lengthen the lifetime of cutting tool 1 that includes third unit layer 17.

The "d" is 0.80 or more and 0.99 or less. According to this, the crystal structure of third unit layer 17 becomes cubic to increase hardness of third unit layer 17 and improve wear resistance. A lower limit of "d" is 0.80 or more, may be 0.82 or more, may be 0.85 or more, or may be 0.87 or more. An upper limit of "d" is 0.99 or less, may be 0.95 or less, may be 0.92 or less, or may be 0.90 or less. "d" may be 0.82 or more and 0.95 or less, may be 0.85 or more and 0.92 or less, or may be 0.87 or more and 0.90 or less.

The "e" is more than 0 and 0.05 or less. According to this, hardness and oxidation resistance of first A layer 13A can be improved. A lower limit of "e" may be 0.002 or more, may be 0.005 or more, may be 0.01 or more, or may be 0.02 or more. The "e" may be 0.04 or less, or may be 0.03 or less. "e" may be 0.002 or more and 0.05 or less, may be 0.01 or more and 0.05 or less, may be 0.01 or more and 0.03 or less, or may be 0.02 or more and 0.03 or less.

The term "the third unit layer is composed of $Ti_dSi_{1-d-e}M_eN$" herein means that third unit layer 17 may contain an inevitable impurity in addition to $Ti_dSi_{1-d-e}M_eN$ as long as the effect of the present disclosure is not impaired. Examples of the inevitable impurity include oxygen and carbon. A content rate of an entirety of the inevitable impurity in third unit layer 17 may be larger than 0 atom % and less than 1 atom %.

The content rates of the "d", the "e", and the inevitable impurity in third unit layer 17 are determined in the same method as the measurement method of the "a". As long as an identical cutting tool 1 is measured, it has been confirmed that the measurement results have no variation even by randomly selecting the measurement positions.

In the composition $W(C_{1-a}Na)_x$ of the first unit layer in the present disclosure, a ratio $A_{N1}/A_{M1}$ of a total number $A_{N1}$ of atoms of C and N relative to a number $A_{M1}$ of atoms of W is 0.8 or more and 1.2 or less. In the composition $Ti_dSi_{1-d-e}M_eN$ of the third unit layer in the present disclosure, a ratio $A_{N3}/A_{M3}$ of a number $A_{N3}$ of atoms of N relative to a total number $A_{M3}$ of atoms of Ti, Si, and M is necessarily 0.8 or more and 1.2 or less in manufacturing. The ratio $A_{N1}/A_{M1}$ and the ratio $A_{N3}/A_{M3}$ can be measured by a Rutherford backscattering (RBS) method. When the ratio $A_{N1}/A_{M1}$ and the ratio $A_{N3}/A_{M3}$ are within the above ranges, it has been confirmed that the effect of the present disclosure is not impaired.

<Average Thickness of First Unit Layers and Average Thickness of Third Unit Layers>

An average thickness of first unit layers 12 may be 0.002 μm or more and 0.2 μm or less, and an average thickness of third unit layers 17 may be 0.002 μm or more and 0.2 μm or less. According to this, development of cracking generated on the surface of coating 3 can be further inhibited. A lower limit of the average thickness of first unit layers 12 may be 0.002 μm or more, may be 0.005 μm or more, or may be 0.01 μm or more. An upper limit of the average thickness of first unit layers 12 may be 0.20 μm or less, may be 0.15 μm or less, or may be 0.10 μm or less. The average thickness of first unit layers 12 may be 0.005 μm or more and 0.15 μm or less, or may be 0.01 μm or more and 0.1 μm or less. A lower limit of the average thickness of third unit layers 17 may be 0.002 μm or more, may be 0.005 μm or more, or may be 0.01 μm or more. An upper limit of the average thickness of third unit layers 17 may be 0.20 μm or less, may be 0.15 μm or less, or may be 0.10 μm or less. The average thickness of third unit layers 17 may be 0.005 μm or more and 0.15 μm or less, or may be 0.01 μm or more and 0.10 μm or less.

The average thickness of first unit layers 12 and the average thickness of third unit layers 17 can be determined by a method same as the measurement method of the thickness of first layer 13.

Figure 10:
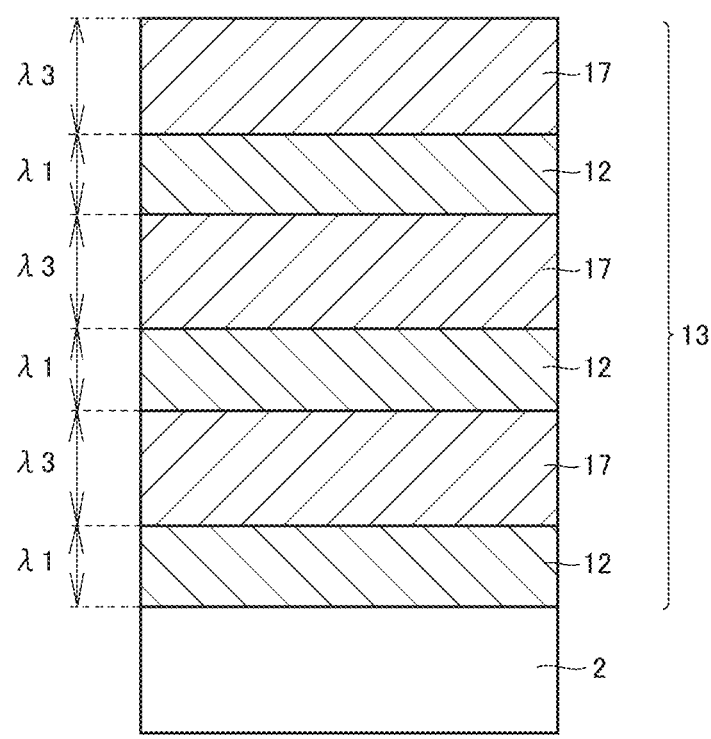
FIG. 10 is a view for describing an example of a ratio between thicknesses of a first unit layer and third unit layer.

As illustrated in FIG. 10, in first unit layer 12 and third unit layer 17 adjacent to first unit layer 12, a ratio λ3/λ1 of a thickness λ3 of third unit layer 17 to a thickness λ1 of first unit layer 12 may be 1.0 or more and 5.0 or less. Third unit layer 17 has high oxidation resistance, and in addition, low thermal conductivity and has a property of hardly conducting heat generated during cutting toward base 2. When the ratio λ3/λ1 is 1.0 or more, a proportion of third unit layer 17 in coating 3 relatively increases to increase an Al amount in coating 3, resulting in improvement of a heat shielding property as an entirety of cutting tool 1. Cutting tool 1 that has coating 3 has particularly improved wear resistance in continuous cutting. When λ3/λ1 is 1.0 or more, toughness of coating 3 tends to be improved. Meanwhile, when λ3/λ1 is 5.0 or less, the effect of inhibiting development of cracking by stacking first unit layer 12 and third unit layer 17 tends to be easily obtained.

λ3/λ1 may be 1.0 or more, may be 1.1 or more, may be 1.2 or more, may be 1.3 or more, may be 1.4 or more, may be 1.5 or more, may be 2.0 or more. λ3/λ1 may be 5.0 or less, may be 4.0 or less, or may be 3.0 or less. λ3/λ1 may be 1.0 or more and 5.0 or less, may be 1.2 or more and 4.0 or less, may be 1.5 or more and 4.0 or less, may be 1.0 or more and 3.0 or less, or may be 2.0 or more and 3.0 or less. Although all thicknesses of three first unit layers 12 are represented as λ1 and all thicknesses of three third unit layers 17 are represented as λ3 in FIG. 10 for description, the thicknesses λ1 of three first unit layers 12 are not needed to be equal, and the thicknesses λ3 of three third unit layers 17 are not needed to be equal as long as the above relationship of λ3/λ1 is satisfied between the first unit layer and the third unit layer adjacent to each other.

In first A layer 13A, the number of stacking of each of first unit layers 12 and third unit layers 17 may be 4 or more and 800 or less, or may be 10 or more and 500 or less. According to this, stacking of first unit layers 12 and third unit layers 17 tends to easily yield an effect of improving the hardness and the compressive residual stress with good balance. In first A layer 13A, the number of stacking of each of first unit layers 12 and third unit layers 17 may be 100 or more and 400 or less, or may be 200 or more and 350 or less.

In first A layer 13A, the number of stacking of each of first unit layers 12 and third unit layers 17 can be determined in the same method as the method of measuring the number of stacking of each of first unit layers 12 and second unit layers 15 described in Embodiment 1.

<Second A Layer>

Figure 8:
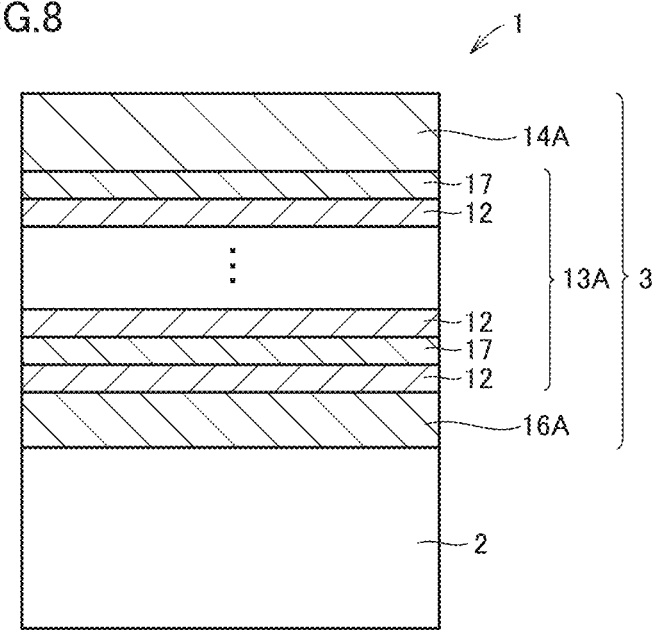
FIG. 8 is a schematic enlarged cross-sectional view of another example of a cutting tool according to Embodiment 2.
Figure 9:
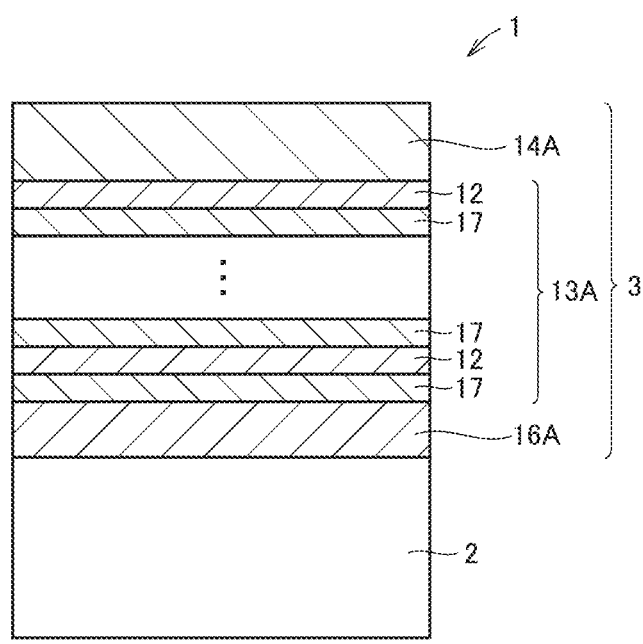
FIG. 9 is a schematic enlarged cross-sectional view of another example of a cutting tool according to Embodiment 2.

As illustrated in FIG. 8 and FIG. 9, coating 3 may further include a second A layer 16A disposed between base 2 and first A layer 13A, and a composition of second A layer 16A may be same as a composition of first unit layer 12 or a composition of third unit layer 17. According to this, adhesiveness between base 2 and coating 3 can be improved.

When the composition of second A layer 16A is same as the composition of first unit layer 12, second A layer 16A has a good sliding property even when second A layer 16A is exposed in initial cutting, and thereby wear resistance can be improved.

When the composition of second A layer 16A is same as the composition of first unit layer 12, a thickness of second A layer 16A may be larger than the thickness of first unit layer 12. According to this, adhesiveness between base 2 and coating 3 can be further improved. Since second A layer 16A has a good sliding property even when second A layer 16A is exposed in initial cutting, wear resistance can be improved. The term "the thickness of the second A layer is larger than the thickness of the first unit layer" can be rephrased to "the thickness of the second A layer is more than 1.0 time larger than the thickness of the first unit layer". The thickness of second A layer 16A may be 2.0 times or more, may be 4.0 times or more, or may be 10.0 times or more larger than the thickness of first unit layer 12. The thickness of second A layer 16A may be 500 times or less, may be 120 times or less, or may be 50 times or less larger than the thickness of first unit layer 12. The thickness of second A layer 16A may be 2.0 times or more and 500 times or less, may be 4.0 times or more and 120 times or less, or may be 10.0 times or more and 50 times or less larger than the thickness of first unit layer 12.

When the composition of second A layer 16A is same as the composition of first unit layer 12, the thickness of second A layer 16A may be 0.1 µm or more. If the thickness of second A layer 16A is less than 0.1 µm, the effect of improving wear resistance by setting second A layer 16A to have the same composition as first unit layer 12 tends to be difficult to obtain. When the composition of second A layer 16A is same as the composition of first unit layer 12, the thickness of second A layer 16A may be 0.3 µm or more, or may be 0.4 µm or more. An upper limit value of the thickness of second A layer 16A is not particularly limited, but more than 2 µm enlarges the crystal grains to generate a grain boundary, which tends to be difficult to obtain the effect of improving wear resistance. Thus, with considering a cost aspect, the thickness of second A layer 16A may be 2 µm or less.

When the composition of second A layer 16A is same as the composition of first unit layer 12, first unit layer 12 may be stacked directly on second A layer 16A, as illustrated in FIG. 8. As illustrated in FIG. 9, second unit layer 15 may also be stacked directly on second A layer 16A. When the composition of second A layer 16A is same as the composition of first unit layer 12 and first unit layer 12 is stacked directly on second A layer 16A, second A layer 16A and first unit layer 12 have a continuous crystal structure.

When the composition of second A layer 16A is same as the composition of third unit layer 17, peeling resistance of coating 3 can be improved particularly in intermittent processing such as milling and endmill processing, which repeatedly applies a load to the cutting edge, because third unit layer 17 tends to have small stress.

When the composition of second A layer 16A is same as the composition of third unit layer 17, the thickness of second A layer 16A may be larger than the thickness of third unit layer 17. According to this, adhesiveness between base 2 and coating 3 can be further improved. Even when second A layer 16A is exposed in initial cutting, oxidation from an interface between base 2 and coating 3 can be inhibited, and the cutting heat can be shielded. The term "the thickness of the second A layer is larger than the thickness of the third unit layer" can be rephrased to "the thickness of the second A layer is more than 1.0 time larger than the thickness of the third unit layer". The thickness of second A layer 16A may be 2.0 times or more, may be 4.0 times or more, or may be 10.0 times or more larger than the thickness of third unit layer 17. The thickness of second A layer 16A may be 500 times or less, may be 120 times or less, or may be 50 times or less larger than the thickness of third unit layer 17. The thickness of second A layer 16A may be 2.0 times or more and 500 times or less, may be 4.0 times or more and 120 times or less, or may be 10.0 times or more and 50 times or less larger than the thickness of third unit layer 17.

When the composition of second A layer 16A is same as the composition of third unit layer 17, the thickness of second A layer 16A may be 0.1 µm or more. If the thickness of second A layer 16A is less than 0.1 µm, the effect of inhibiting the oxidation from the interface between base 2 and coating 3 and the effect of shielding the cutting heat by setting second A layer 16A to have the same composition as third unit layer 17 tend to be difficult to obtain. When the composition of second A layer 16A is same as the composition of third unit layer 17, the thickness of second A layer 16A may be 0.3 µm or more, or may be 0.4 µm or more. An upper limit value of the thickness of second A layer 16A is not particularly limited, but more than 2 µm enlarges the crystal grains to generate a grain boundary, which tends to be difficult to further improve the effect of inhibiting the oxidation. Thus, with considering a cost aspect, the thickness of second A layer 16A may be 2 µm or less.

When the composition of second A layer 16A is same as the composition of third unit layer 17, first unit layer 12 may be stacked directly on second A layer 16A, as illustrated in FIG. 8. As illustrated in FIG. 9, third unit layer 17 may also be stacked directly on second A layer 16A. When the composition of second A layer 16A is same as the composition of third unit layer 17 and third unit layer 17 is stacked directly on second A layer 16A, second A layer 16A and third unit layer 17 have a continuous crystal structure.

<Third A Layer>

As illustrated in FIG. 6 to FIG. 9, coating 3 may further include a third A layer 14A provided on a side opposite to base 2 of first layer 13, and third A layer 14A may be composed of TiSiMeCN. Herein, Me may represent boron, yttrium, cerium, or lanthanum. Me may be the same element as M used in the third unit layer.

According to this, a frictional coefficient of coating 3 can be reduced to attempt to lengthen the lifetime of cutting tool 1.

A carbonitride typically tends to have a lower frictional coefficient against workpiece than a nitride. Such lowering of the frictional coefficient is presumably derived from contribution of the carbon atoms. Coating 3 that includes third A layer 14A lowers the frictional coefficient of coating 3 against the workpiece to lengthen the lifetime of cutting tool 1.

In third A layer 14A, regulating a composition ratio between N and C enables to impart a predetermined color. According to this, design properties and distinctive properties can be imparted to appearance of cutting tool 1, which yields commercial usefulness.

A thickness of third A layer 14A may be 0.1 µm or more. When the thickness of third A layer 14A is 0.1 µm or more, an effect of imparting lubricity by third A layer 14A is easily obtained. Meanwhile, an upper limit value of the thickness of third A layer 14A is not particularly limited, but more than 2 µm tends to fail to further improve the aforementioned effect of imparting lubricity. Thus, the thickness of third A layer 14A may be 2 µm or less with considering a cost aspect.

Embodiment 3: Method for Manufacturing Cutting Tool

In Embodiment 3, a method for manufacturing cutting tool 1 of Embodiment 1 or Embodiment 2 will be described. The manufacturing method comprises: a first step of preparing a base 2; and a second step of forming a coating 3 on base 2. The second step comprises a step of forming a first layer 13 or a first A layer 13A. Each step will be described in detail hereinafter.

<First Step>

In the first step, base 2 is prepared. As base 2, base 2 described in Embodiment 1 may be used.

When a cemented carbide is used as base 2, commercially available bases may be used, or base 2 may be manufactured by a common powder metallurgy method. When base 2 is manufactured by a common powder metallurgy method, WC powder, Co powder, and the like are mixed with a ball mill or the like to obtain a mixed powder. This mixed powder is dried, and then molded into a predetermined shape to obtain a molded article. Thereafter, the molded article is sintered to obtain a WC—Co-based cemented carbide (sintered material). Then, this sintered material may be subjected to a predetermined cutting-edge treatment such as a homing treatment to manufacture a base composed of the WC—Co-based cemented carbide. Any bases conventionally known as such a type of bases, other than the above base, may also be prepared.

<Second Step>

In the second step, coating 3 is formed on base 2. The second step comprises a step of forming first layer 13 or first A layer 13A.

In "the step of forming the first layer", first unit layer 12 and second unit layer 15 are alternately stacked by using a physical vapor deposition (PVD) method to form first layer 13. In "the step of forming the first A layer", first unit layer 12 and third unit layer 17 are alternately stacked by using a PVD method to form first A layer 13A. To improve wear resistance of coating 3 that includes first layer 13 or first A layer 13A, it is effective to form a layer composed of a compound that has high crystallinity. The present inventors have investigated various methods as a method for forming first layer 13 and first A layer 13A, and consequently found that the layer composed of a compound that has high crystallinity can be formed and coating 3 has excellent wear resistance by using the physical vapor deposition method.

As the PVD method, at least one selected from the group consisting of a cathode arc-ion plating method, a balanced magnetron sputtering method, an unbalanced magnetron sputtering method, and a high power impulse magnetron sputtering (HiPIMS) method may be used. In particular, a cathode arc-ion plating method that has a high ionization rate of raw material elements may be used. When the cathode arc-ion plating method is used, an ion bombardment treatment with metal for a surface of base 2 can be performed before first layer 13 or first A layer 13A is formed. Thus, adhesiveness between base 2 and coating 3 that includes first layer 13 or first A layer 13A is remarkably improved.

The cathode arc-ion plating method can be performed by: placing base 2 in an apparatus and placing a target as a cathode; and then applying high voltage to the target for generating arc discharge to ionize and evaporate atoms that constitute the target; and depositing a substance on base 2, for example.

The balanced magnetron sputtering method can be performed by: placing base 2 in an apparatus and placing a target on a magnetron electrode that has a magnet to form a balanced magnetic field; applying high-frequency electric power between the magnetron electrode and base 2 to generate gas plasma; and allowing gas ions generated by generation of this gas plasma to collide with the target; and depositing atoms released from the target on base 2, for example.

The unbalanced magnetron sputtering method can be performed by setting the magnetic field to be generated by the magnetron electrode to be unbalanced in the aforementioned balanced magnetron spattering method, for example. The HiPIMS method, which can apply further higher voltage to obtain a dense film, may also be used.

<Other Steps>

The second step may comprise, in addition to the step of forming first layer 13 or first A layer 13A, a step of treating a surface of the coating, such as polishing using a brush and a dry or wet shot blasting. The second step may also comprise a step of forming other layers such as a second layer 16, a second A layer 16A, a third layer 14, a third A layer 14A, and an intermediate layer. The other layers can be formed by conventionally known chemical vapor deposition method or physical vapor deposition method. From the viewpoint of ability of forming the other layer continuously to first unit layer 12, second unit layer 15, or third unit layer 17 in one physical vapor deposition apparatus, the other layer is preferably formed by a physical vapor deposition method.

EXAMPLES

The present embodiments will be further specifically described with Examples. However, the present embodiments are not limited by these Examples.

Example 1

<Sample 1 to Sample 25 and Sample 101 to Sample 106>
<<Production of Cutting Tool>>

Figure 11:
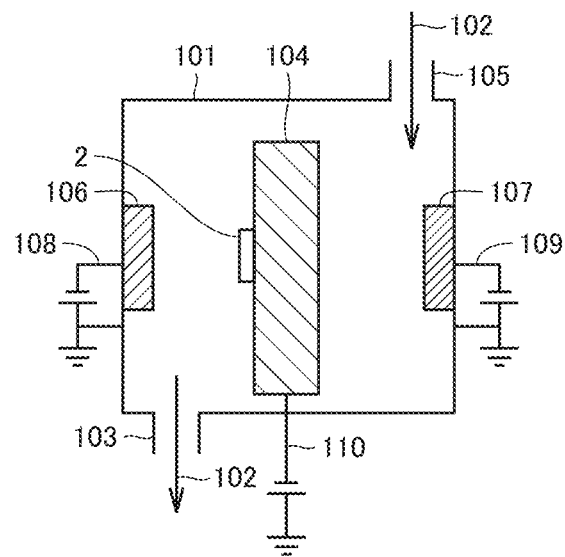
FIG. 11 is a schematic cross-sectional view of a cathode arc-ion plating apparatus used in Example.
Figure 12:
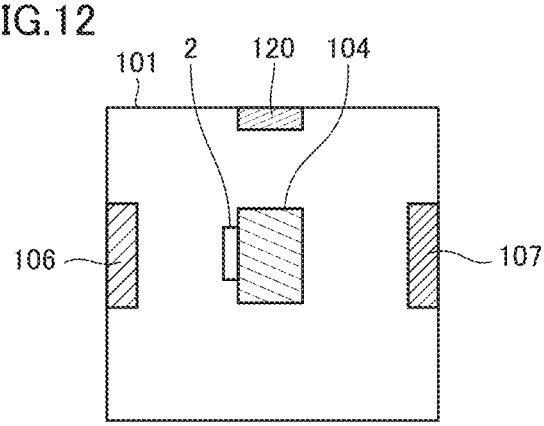
FIG. 12 is a schematic top view of the cathode arc-ion plating apparatus illustrated in FIG. 11.

FIG. 11 is a schematic cross-sectional view of a cathode arc-ion plating apparatus used in the present Example. FIG. 12 is an outline top view of the apparatus in FIG. 11.

In the apparatus in FIG. 11 and FIG. 12, a cathode 106 for a first unit layer, a cathode 107 for a second unit layer, and a cathode 120 for a third layer, which are alloy targets to be metal raw materials of a coating 3, and a rotary base holder 104 for placing the base are attached in a chamber 101. A composition of cathode 106 is adjusted to obtain a composition of the first unit layer in Table 1. A composition of cathode 107 is adjusted to obtain a composition of the second unit layer in Table 1. A composition of cathode 120 is adjusted to obtain a composition of the third layer in Table 2.

An arc power source 108 is attached to cathode 106, an arc power source 109 is attached to cathode 107, and an arc power source (not illustrated) is attached to cathode 120. A bias power source 110 is attached to base holder 104. In chamber 101, a gas introducing port 105 to introduce gas 102 is provided and a gas discharging port 103 is provided for regulating a pressure in chamber 101, and chamber 101 has structure in which gas 102 in chamber 101 can be sucked by a vacuum pump through gas discharging port 103.

On base holder 104, a chip of CNMG120408 that was a cemented carbide of JIS Standard P30 grade and that had JIS Standard shape, and a chip of SEMT13T3AGSN manufactured by Sumitomo Electric Hardmetal Corp. were attached as the base.

Then, a pressure in chamber 101 was reduced by the vacuum pump, and a temperature was raised to 500° C. by a heater placed in the apparatus while rotating the base, and evacuation was performed until the pressure in chamber 101 reached $1.0 \times 10^{-4}$ Pa. Then, argon gas was introduced through the gas introducing port to hold the pressure in chamber 101 to be 2.0 Pa, a voltage of bias power source 110 was gradually raised to −1000 V, and cleaning of a surface of the base was performed for 15 minutes. Thereafter, the argon gas was discharged from chamber 101 to clean the base (argon bombard treatment). As above, the base of a cutting tool of each sample was prepared.

Then, in a state where the base was rotated at a center, arc current was supplied to cathodes 106 and 107 at each 100 A while introducing argon and nitrogen as reaction gases and holding a base temperature at 400° C., a reaction gas pressure at 3.0 Pa, a voltage of bias power source 110 at a predetermined constant value within a range of −50 V to −200 V to generate metal ions from cathodes 106 and 107, and the second layer that had a composition shown in Table 2 and the first layer that had a composition shown in Table 1 were formed on the base. Here, a purpose of introducing the argon gas was to clean a surface of a WC cathode used in a case where a first unit layer $W(C_{1-a}Na)_x$ was formed. In the manufacturing method of the present disclosure, the base temperature was 400° C., which was lower than a formation temperature of a conventional nitride film, 600° C. The reason is as follows. The present inventors have found a tendency of deterioration of hardness of a coating when the coating is formed at the base temperature of 600° C. The present inventors have investigated the reason, and presumed that, when the coating is formed at the base temperature of 600° C., carbon (C) contained in the cathode for the first unit layer becomes free carbon to precipitate in the formed coating. As a result of intensive investigation, the present inventors have found that a coating that keeps excellent hardness even at high temperature and that has excellent wear resistance can be formed by forming the coating at a base temperature of 400° C.

When the second layer was formed, the first layer was formed by alternately stacking each of the first unit layers and the second unit layers one by one on the second layer with the number of stacking shown in Table 1. When the second layer was not formed, the first layer was formed by alternately stacking each of the first unit layers and the second unit layers one by one on the base with the number of stacking shown in Table 1. The thickness of the second layer, each thickness and the number of stacking of each of the first unit layers and the second unit layers in the first layer were regulated by a rotation speed of the base. At a time when the thicknesses of the second layer and the first layer reached the thicknesses respectively shown in Table 1 and Table 2, current supplied to the evaporation source was stopped.

Then, while introducing argon, nitrogen, and methane gas as reaction gasses into chamber 101 and holding a base temperature at 400° C., a reaction gas pressure at 2.0 Pa, and the voltage of bias power source 110 at −350 V, arc current at 80 A was supplied to cathode 120 to generate metal ions from cathode 120, and a third layer was formed on the first layer. At a time when a thickness of the third layer reached a thickness shown in Table 2, current supplied to the evaporation source was stopped. An amount of introduced nitrogen and an amount of introduced methane gas were regulated so as to obtain a composition of the third layer in Table 2. As above, the cutting tool of each sample was produced.

[Table 1]

TABLE 1

| | First layer | | | | | | | | |
|---|---|---|---|---|---|---|---|---|---|
| | First unit layer ($W(C_{1-a}N_a)_x$) | | | | Second unit layer ($Ti_cSi_{1-c}N$) | | | | |
| Sample No. | a | x | Average thickness [μm] | Hexagonal crystal structure | c | Average thickness [μm] | λ2/λ1 | Number of stacking | Thickness [μm] |
| 1 | 0.30 | 0.80 | 0.005 | present | 0.85 | 0.006 | 1.2 | 300 | 3.3 |
| 2 | 0.30 | 1.00 | 0.006 | present | 0.90 | 0.008 | 1.3 | 240 | 3.4 |
| 3 | 0.30 | 1.20 | 0.007 | present | 0.95 | 0.010 | 1.4 | 200 | 3.4 |
| 4 | 0.55 | 1.00 | 0.010 | present | 0.85 | 0.012 | 1.2 | 300 | 6.6 |
| 5 | 0.80 | 0.80 | 0.100 | present | 0.82 | 0.150 | 1.5 | 13 | 3.3 |
| 6 | 0.80 | 1.00 | 0.150 | present | 0.92 | 0.180 | 1.2 | 40 | 13.2 |
| 7 | 0.80 | 1.20 | 0.015 | present | 0.97 | 0.025 | 1.7 | 75 | 3.0 |
| 8 | 0.35 | 0.85 | 0.003 | present | 0.80 | 0.005 | 1.7 | 400 | 3.2 |
| 9 | 0.40 | 0.90 | 0.005 | present | 0.90 | 0.020 | 4.0 | 500 | 12.5 |
| 10 | 0.45 | 1.00 | 0.007 | present | 0.99 | 0.012 | 1.7 | 160 | 3.0 |
| 11 | 0.50 | 1.10 | 0.005 | present | 0.85 | 0.004 | 0.8 | 330 | 3.0 |
| 12 | 0.60 | 1.10 | 0.008 | present | 0.90 | 0.008 | 1.0 | 200 | 3.2 |
| 13 | 0.65 | 1.00 | 0.050 | present | 0.99 | 0.125 | 2.5 | 20 | 3.5 |
| 14 | 0.70 | 0.90 | 0.030 | present | 0.88 | 0.150 | 5.0 | 18 | 3.2 |
| 15 | 0.75 | 0.90 | 0.005 | present | 0.88 | 0.030 | 6.0 | 90 | 3.2 |
| 16 | 0.60 | 1.10 | 0.007 | present | 0.80 | 0.009 | 1.3 | 210 | 3.4 |
| 17 | 0.60 | 1.00 | 0.002 | present | 0.81 | 0.002 | 1.0 | 800 | 3.2 |
| 18 | 0.50 | 1.00 | 0.200 | present | 0.81 | 0.200 | 1.0 | 8 | 3.2 |
| 19 | 0.50 | 1.00 | 0.300 | present | 0.87 | 0.400 | 1.3 | 4 | 2.8 |
| 20 | 0.55 | 1.00 | 0.005 | present | 0.87 | 0.008 | 1.6 | 250 | 3.3 |
| 21 | 0.60 | 1.10 | 0.006 | present | 0.93 | 0.008 | 1.3 | 250 | 3.5 |
| 22 | 0.50 | 1.00 | 0.006 | present | 0.93 | 0.008 | 1.3 | 250 | 3.5 |
| 23 | 0.55 | 1.00 | 0.006 | present | 0.80 | 0.008 | 1.3 | 200 | 2.8 |
| 24 | 0.45 | 0.90 | 0.006 | present | 0.90 | 0.008 | 1.3 | 35 | 0.5 |
| 25 | 0.50 | 0.90 | 0.006 | present | 0.84 | 0.008 | 1.3 | 1070 | 15.0 |
| 101 | 0.20 | 0.70 | 0.005 | absent | 0.85 | 0.006 | 1.2 | 300 | 3.3 |
| 102 | 0.90 | 1.30 | 0.005 | absent | 0.85 | 0.006 | 1.2 | 300 | 3.3 |
| 103 | 0.35 | 0.85 | 0.003 | present | 0.70 | 0.005 | 1.7 | 400 | 3.2 |

TABLE 1-continued

| | First layer | | | | | | | |
|---|---|---|---|---|---|---|---|---|
| | First unit layer (W(C$_{1-a}$N$_a$)$_x$) | | | | Second unit layer (Ti$_c$Si$_{1-c}$N) | | | |
| Sample No. | a | x | Average thickness [μm] | Hexagonal crystal structure | c | Average thickness [μm] | λ2/λ1 | Number of stacking | Thickness [μm] |
| 104 | 0.45 | 1.00 | 0.007 | present | 1.00 | 0.012 | 1.7 | 160 | 3.0 |
| 105 | 0.45 | 1.00 | 3.000 | present | — | — | — | 1 | 3.0 |
| 106 | — | — | — | — | 0.85 | 3.000 | — | 1 | 3.0 |

[Table 2]

TABLE 2

| | Second layer | | Third layer | | Coating | Cutting test 1 Cutting | Cutting test 2 Cut |
|---|---|---|---|---|---|---|---|
| Sample No. | Composition | Thickness [μm] | Composition | Thickness [μm] | thickness [μm] | time [min] | length [km] |
| 1 | — | — | — | — | 3.3 | 83 | 7.8 |
| 2 | — | — | — | — | 3.4 | 78 | 7.5 |
| 3 | — | — | — | — | 3.4 | 85 | 7.7 |
| 4 | — | — | — | — | 6.6 | 97 | 8.3 |
| 5 | — | — | — | — | 3.3 | 80 | 7.6 |
| 6 | — | — | — | — | 13.2 | 110 | 8.7 |
| 7 | — | — | — | — | 3.0 | 83 | 7.5 |
| 8 | — | — | — | — | 3.2 | 86 | 7.6 |
| 9 | — | — | — | — | 12.5 | 105 | 8.4 |
| 10 | — | — | — | — | 3.0 | 87 | 7.9 |
| 11 | — | — | — | — | 3.0 | 52 | 4.0 |
| 12 | — | — | — | — | 3.2 | 88 | 7.8 |
| 13 | — | — | — | — | 3.5 | 84 | 7.6 |
| 14 | — | — | — | — | 3.2 | 95 | 7.9 |
| 15 | — | — | — | — | 3.2 | 55 | 4.4 |
| 16 | — | — | — | — | 3.4 | 86 | 7.6 |
| 17 | — | — | — | — | 3.2 | 87 | 7.7 |
| 18 | — | — | — | — | 3.2 | 83 | 7.5 |
| 19 | — | — | — | — | 2.8 | 74 | 7.3 |
| 20 | W(C$_{0.45}$N$_{0.55}$) | 0.5 | — | — | 3.8 | 88 | 8.0 |
| 21 | Ti$_{0.93}$Si$_{0.07}$N | 0.5 | — | — | 4.0 | 87 | 7.8 |
| 22 | — | — | Ti$_{0.93}$Si$_{0.07}$CN | 0.6 | 4.1 | 99 | 8.1 |
| 23 | W(C$_{0.45}$N$_{0.55}$) | 0.7 | Ti$_{0.80}$Si$_{0.20}$CN | 0.8 | 4.3 | 101 | 8.3 |
| 24 | — | — | — | — | 0.5 | 73 | 4.8 |
| 25 | — | — | — | — | 15.0 | 104 | 8.4 |
| 101 | — | — | — | — | 3.3 | 28 | 2.8 |
| 102 | — | — | — | — | 3.3 | 26 | 2.8 |
| 103 | — | — | — | — | 3.2 | 24 | 2.7 |
| 104 | — | — | — | — | 3.0 | 21 | 2.2 |
| 105 | — | — | — | — | 3.0 | 18 | 1.4 |
| 106 | — | — | — | — | 3.0 | 20 | 1.6 |

<<Evaluation>>

On the cutting tool according to each sample, measured were the composition of the first unit layer, the composition of the second unit layer, the composition of the second layer, the composition of the third layer, the number of stacking of each of the first unit layers and the second unit layers, the average thickness of the first unit layers, the average thickness of the second unit layers, the thickness of the first layer, the thickness of the second layer, the thickness of the third layer, λ2/λ1, crystal structure of the first unit layer, and hardness of the coating.

<Measurement of Composition of First Unit Layer>

The composition of the first unit layer in the cutting tool of each sample was measured by the method described in Embodiment 1 to obtain values of "a" and "x" in W(C$_{1-a}$N$_a$)$_x$. The results are shown in the columns "a" and "x" in Table 1. In Table 1, a case where "-" are described in the column "a" and the column "x" means that the first unit layer is absent.

<Measurement of Composition of Second Unit Layer>

The composition of the second unit layer in the cutting tool of each sample was measured by the method described in Embodiment 1 to obtain a value of "c" in Ti$_c$Si$_{1-c}$N. The results are shown in the column "c" in Table 1. In Table 1, a case where "-" is described in the column "c" means that the second unit layer is absent.

<Measurements of Composition of Second Layer and Composition of Third Layer>

The compositions of the second layer and the third layer in the cutting tool of each sample were determined by the method described in Embodiment 1. The results are shown in the column "Composition" of "Second layer" and the column "Composition" of "Third layer" in Table 2. A case where "-" is described in the column "Composition" of "Second layer" in Table 2 means that the second layer is absent, and a case where "-" is described in the column "Composition" of "Third layer" means that the third layer is absent.

<Measurement of Number of Stacking>

The number of stacking of each of the first unit layers and second unit layers in the cutting tool of each sample was determined by the method described in Embodiment 1. For example, the number of stacking of 10 represents that the alternate layer includes 10 first unit layers and 10 second unit layers. The obtained results are each shown in the column "Number of stacking" in Table 1.

<Measurements of Average Thickness of First Unit Layers, Average Thickness of Second Unit Layers, Thickness of First Layer, Thickness of Second Layer, and Thickness of Third Layer>

On the cutting tool of each sample, the average thickness of the first unit layers, the average thickness of the second unit layers, the thickness of the first layer, the thickness of the second layer, and the thickness of the third layer were determined by the method described in Embodiment 1. The obtained results are shown in the columns "Average thickness [µm]" of "First unit layer", "Average thickness [µm]" of "Second unit layer", and "Thickness [µm]" of "First layer" in Table 1, and "Thickness [µm]" of "Second layer", and "Thickness [µm]" of "Third layer" in Table 2. In Table 2, a case where "-" is described in the column "Thickness [µm]" of "Second layer" means that the second layer is absent. In Table 2, a case where "-" is described in the column "Thickness [µm]" of "Third layer" means that the third layer is absent.

<Measurement of $\lambda 2/\lambda 1$>

$\lambda 2/\lambda 1$ of the cutting tool of each sample was determined by the method described in Embodiment 1. The obtained results are shown in the column "$\lambda 2/\lambda 1$" in Table 1. In Table 1, a case where "-" is described in the column "$\lambda 2/\lambda 1$" means that at least any of the first unit layer and the second unit layer is absent.

<Measurement of Crystal Structure of First Unit Layer>

On the cutting tool of each sample, whether the first unit layer had a hexagonal crystal structure or not was determined by XRD measurement on the first unit layer. The specific method was as described in Embodiment 1. The results are shown in the column "Hexagonal crystal structure" of "First unit layer" in Table 1. The description "present" represents that the first unit layer has the hexagonal crystal structure, and the description "absent" represents the first unit layer does not have the hexagonal crystal structure. The crystal structure of the second unit layer was measured to confirm that the second unit layer had a cubic crystal structure in all samples.

<Measurement of Hardness of Coating>

Hardness of the coating of Sample 1 to Sample 25 was measured by the method described in Embodiment 1. The hardness of the coating of these samples was confirmed to be within a range of 30 GPa or more and 55 GPa or less.

<Cutting Test 1: Continuous Turning Test>

With the cutting tool of each sample that had a CNMG120408 shape, dry continuous turning test was performed under the following cutting conditions to measure a time until an amount of wear on a flank face of a cutting edge reached 0.2 mm. The results are shown in the column "Cutting time [min]" in Table 2. A longer cutting time indicates a longer tool lifetime.

<<Cutting Conditions>>
Workpiece: SCM440 (HB=300)
Cutting rate: 260 m/min
Feeding rate: 0.3 mm/rev
Depth of cut: 2.0 mm
Coolant: dry The cutting processing performed under the above cutting conditions is high-speed high-efficiency processing of a hard-to-cut material, and corresponds to cutting processing performed under conditions of high cutting edge temperature.

The cutting tools of Sample 1 to Sample 25 correspond to Examples, and the cutting tools of Sample 101 to Sample 106 correspond to Comparative Examples. The cutting tools of Sample 1 to Sample 25 were confirmed to have a long tool lifetime compared with the cutting tools of Sample 101 to Sample 106 in the cutting processing performed under the conditions of high cutting edge temperature.

<Cutting Test 2: Milling Test>

With the cutting tool of each sample that had a SEMT13T3AGSN shape, surface milling was performed under the following cutting conditions by fitting: a center line of a plate made of a hard-to-cut material with 150 mm in width; and a center of the cutter with (D160 mm, which was wider than the plate, to measure a cut length until an amount of wear on a flank face of a cutting edge reached 0.2 mm. The results are shown in the column "Cut length [km]" in Table 2. A longer cut length indicates a longer lifetime.

<<Cutting Conditions>>
Workpiece: SKD11 (HB=235)
Cutting rate: 190 m/min
Feeding rate: 0.15 mm/t
Axial depth of cut "ap": 1.5 mm
Radial depth of cut "ae": 150 mm
Coolant: dry The cutting processing performed under the above cutting conditions is high-speed high-efficiency milling of a hard-to-cut material under a dry condition, and corresponds to cutting processing performed under conditions of high cutting edge temperature.

The cutting tools of Sample 1 to Sample 25 correspond to Examples, and the cutting tools of Sample 101 to Sample 106 correspond to Comparative Examples. The cutting tools of Sample 1 to Sample 25 were confirmed to have a long tool lifetime compared with the cutting tools of Sample 101 to Sample 106 in the cutting processing performed under the conditions of high cutting edge temperature.

Example 2

<Sample 51 to Sample 78 and Sample 151 to Sample 164>
<<Production of Cutting Tool>>

A base of each sample was performed in the same manner as in Example 1. In a state where the base was rotated at a center, arc current was supplied to cathodes 106 and 107 at each 100 A while introducing argon and nitrogen as reaction gases and holding a base temperature at 450° C., a reaction gas pressure at 2.0 Pa, a voltage of bias power source 110 at a predetermined constant value within a range of −50 V to −200 V to generate metal ions from cathodes 106 and 107, and a second A layer and a first A layer that had a composition shown in Table 3 to Table 6 were formed on the base. The composition of cathode 106 was regulated so as to obtain the composition of the first unit layer in Table 3 to Table 4. The composition of cathode 107 was regulated so as to obtain the composition of the third unit layer in Table 3 to Table 4. The composition of cathode 120 was regulated so as to obtain the composition of the third A layer in Table 5 to Table 6. In the manufacturing method of the present disclosure, the base temperature was 450° C., which was lower than a formation temperature of a conventional nitride film, 600° C. The reason is as follows. The present inventors have found a tendency of deterioration of hardness of a coating when the coating is formed at the base temperature of 600° C. The present inventors have investigated the reason, and presumed that, when the coating is formed at the base temperature of 600° C., carbon (C) contained in the cathode for the first unit layer becomes free carbon to precipitate in the formed coating. As a result of intensive investigation, the present inventors have found that a coating that keeps excellent hardness even at high temperature and that has excellent wear resistance can be formed by forming the coating at a base temperature of 450° C.

When the second A layer was formed, the first A layer was formed by alternately stacking each of the first unit layers and the third unit layers one by one on the second A layer with the number of stacking shown in Table 3 to Table 4. When the second A layer was not formed, the first A layer was formed by alternately stacking each of the first unit layers and the third unit layers one by one on the base with the number of stacking shown in Table 3 to Table 4. The thickness of the second A layer, each thickness and the number of stacking of the first unit layers and the third unit layers in the first A layer were regulated by a rotation speed of the base. At a time when the thicknesses of the second A layer and the first A layer reached the thicknesses respectively shown in Table 3 to Table 6, current supplied to the evaporation source was stopped.

Then, while introducing argon, nitrogen, and methane gas as reaction gasses into chamber 101 and holding a base temperature at 350° C., a reaction gas pressure at 2.0 Pa, and a voltage of bias power source 110 at −350 V, arc current at 100 A was supplied to cathode 120 to generate metal ions from cathode 120, and a third A layer was formed on the first A layer. At a time when a thickness of the third A layer reached a thickness shown in Table 5 to Table 6, current supplied to the evaporation source was stopped. An amount of introduced nitrogen and an amount of introduced methane gas were regulated so as to obtain a composition of the third A layer in Table 5 to Table 6. As above, the cutting tool of each sample was produced.

[Table 3]

TABLE 3

| | First A layer | | | | | | | | | | |
|---|---|---|---|---|---|---|---|---|---|---|---|
| | First unit layer ($W(C_{1-a}N_a)_x$) | | | | Third unit layer ($Ti_dSi_{1-d-e}M_eN$) | | | | | | |
| Sample No. | a | x | Average thickness [μm] | Hexagonal crystal structure | d | e | M | Average thickness [μm] | λ3/λ1 | Number of stacking | Thickness [μm] |
| 51 | 0.30 | 0.80 | 0.005 | present | 0.800 | 0.010 | B  | 0.006 | 1.2 | 300 | 3.3 |
| 52 | 0.30 | 1.20 | 0.005 | present | 0.800 | 0.050 | B  | 0.007 | 1.4 | 280 | 3.4 |
| 53 | 0.50 | 1.00 | 0.004 | present | 0.850 | 0.030 | B  | 0.008 | 2.0 | 260 | 3.1 |
| 54 | 0.80 | 0.80 | 0.006 | present | 0.900 | 0.010 | B  | 0.020 | 3.3 | 140 | 3.6 |
| 55 | 0.80 | 1.20 | 0.010 | present | 0.990 | 0.005 | B  | 0.050 | 5.0 | 50  | 3.0 |
| 56 | 0.30 | 0.80 | 0.006 | present | 0.800 | 0.010 | Y  | 0.013 | 2.2 | 200 | 3.8 |
| 57 | 0.50 | 1.00 | 0.007 | present | 0.850 | 0.050 | Y  | 0.024 | 3.4 | 100 | 3.1 |
| 58 | 0.35 | 0.95 | 0.008 | present | 0.900 | 0.010 | Y  | 0.010 | 1.3 | 150 | 2.7 |
| 59 | 0.80 | 1.20 | 0.005 | present | 0.990 | 0.005 | Y  | 0.006 | 1.2 | 250 | 2.8 |
| 60 | 0.30 | 0.80 | 0.005 | present | 0.800 | 0.010 | Ce | 0.007 | 1.4 | 250 | 3.0 |
| 61 | 0.60 | 0.95 | 0.006 | present | 0.850 | 0.050 | Ce | 0.008 | 1.3 | 250 | 3.5 |
| 62 | 0.50 | 1.00 | 0.005 | present | 0.900 | 0.010 | Ce | 0.005 | 1.0 | 300 | 3.0 |
| 63 | 0.80 | 1.20 | 0.007 | present | 0.990 | 0.005 | Ce | 0.009 | 1.3 | 220 | 3.5 |
| 64 | 0.30 | 0.80 | 0.005 | present | 0.800 | 0.010 | La | 0.015 | 3.0 | 180 | 3.6 |
| 65 | 0.60 | 1.00 | 0.005 | present | 0.850 | 0.050 | La | 0.020 | 4.0 | 110 | 2.8 |
| 66 | 0.50 | 1.00 | 0.006 | present | 0.900 | 0.010 | La | 0.008 | 1.3 | 250 | 3.5 |
| 67 | 0.80 | 1.20 | 0.006 | present | 0.990 | 0.005 | La | 0.012 | 2.0 | 200 | 3.6 |
| 68 | 0.60 | 1.10 | 0.005 | present | 0.800 | 0.020 | B  | 0.005 | 1.0 | 280 | 2.8 |
| 69 | 0.55 | 1.00 | 0.005 | present | 0.820 | 0.030 | Y  | 0.013 | 2.5 | 200 | 3.5 |
| 70 | 0.55 | 1.00 | 0.005 | present | 0.870 | 0.030 | Ce | 0.025 | 5.0 | 100 | 3.0 |
| 71 | 0.60 | 0.95 | 0.005 | present | 0.920 | 0.030 | La | 0.030 | 6.0 | 80  | 2.8 |
| 72 | 0.60 | 1.00 | 0.002 | present | 0.990 | 0.005 | B  | 0.002 | 1.0 | 800 | 3.2 |
| 73 | 0.60 | 1.00 | 0.200 | present | 0.850 | 0.010 | Y  | 0.200 | 1.0 | 10  | 4.0 |
| 74 | 0.55 | 0.95 | 0.300 | present | 0.900 | 0.020 | Ce | 0.200 | 0.7 | 10  | 5.0 |
| 75 | 0.60 | 0.95 | 0.050 | present | 0.900 | 0.020 | La | 0.060 | 1.2 | 30  | 3.3 |
| 76 | 0.60 | 1.00 | 0.150 | present | 0.950 | 0.030 | B  | 0.180 | 1.2 | 10  | 3.3 |
| 77 | 0.60 | 1.05 | 0.030 | present | 0.900 | 0.030 | Y  | 0.090 | 3.0 | 4   | 0.5 |
| 78 | 0.65 | 1.00 | 0.070 | present | 0.850 | 0.010 | Ce | 0.090 | 1.3 | 94  | 15.0 |

[Table 4]

TABLE 4

<table>
<tr><th rowspan="3">Sample No.</th><th colspan="4">First A layer</th><th colspan="7"></th></tr>
<tr><th colspan="4">First unit layer (W(C$_{1-a}$N$_a$)$_x$)</th><th colspan="4">Third unit layer (Ti$_d$Si$_{1-d-e}$M$_e$N)</th><th rowspan="2">λ3/λ1</th><th rowspan="2">Number of stacking</th><th rowspan="2">Thickness [μm]</th></tr>
<tr><th>a</th><th>x</th><th>Average thickness [μm]</th><th>Hexagonal crystal structure</th><th>d</th><th>e</th><th>M</th><th>Average thickness [μm]</th></tr>
<tr><td>151</td><td>0.30</td><td>0.80</td><td>0.005</td><td>present</td><td>0.700</td><td>0.060</td><td>B</td><td>0.006</td><td>1.2</td><td>300</td><td>3.3</td></tr>
<tr><td>152</td><td>0.20</td><td>0.70</td><td>0.005</td><td>absent</td><td>0.800</td><td>0.010</td><td>B</td><td>0.006</td><td>1.2</td><td>300</td><td>3.3</td></tr>
<tr><td>153</td><td>0.90</td><td>1.30</td><td>0.010</td><td>absent</td><td>0.990</td><td>0.005</td><td>B</td><td>0.050</td><td>5.0</td><td>50</td><td>3.0</td></tr>
<tr><td>154</td><td>0.30</td><td>0.80</td><td>0.006</td><td>present</td><td>0.700</td><td>0.060</td><td>Y</td><td>0.013</td><td>2.2</td><td>200</td><td>3.8</td></tr>
<tr><td>155</td><td>0.20</td><td>0.70</td><td>0.006</td><td>absent</td><td>0.800</td><td>0.010</td><td>Y</td><td>0.013</td><td>2.2</td><td>200</td><td>3.8</td></tr>
<tr><td>156</td><td>0.90</td><td>1.30</td><td>0.005</td><td>absent</td><td>0.990</td><td>0.005</td><td>Y</td><td>0.006</td><td>1.2</td><td>250</td><td>2.8</td></tr>
<tr><td>157</td><td>0.20</td><td>0.70</td><td>0.005</td><td>absent</td><td>0.800</td><td>0.010</td><td>La</td><td>0.015</td><td>3.0</td><td>180</td><td>3.6</td></tr>
<tr><td>158</td><td>0.90</td><td>1.30</td><td>0.006</td><td>absent</td><td>0.990</td><td>0.005</td><td>La</td><td>0.012</td><td>2.0</td><td>200</td><td>3.6</td></tr>
<tr><td>159</td><td>0.30</td><td>0.80</td><td>0.005</td><td>present</td><td>0.700</td><td>0.060</td><td>La</td><td>0.015</td><td>3.0</td><td>180</td><td>3.6</td></tr>
<tr><td>160</td><td>0.50</td><td>1.00</td><td>3.100</td><td>present</td><td>—</td><td>—</td><td>—</td><td>—</td><td>—</td><td>—</td><td>3.1</td></tr>
<tr><td>161</td><td>—</td><td>—</td><td>—</td><td>—</td><td>0.800</td><td>0.050</td><td>B</td><td>3.400</td><td>—</td><td>—</td><td>3.3</td></tr>
<tr><td>162</td><td>—</td><td>—</td><td>—</td><td>—</td><td>0.850</td><td>0.050</td><td>Y</td><td>3.100</td><td>—</td><td>—</td><td>3.1</td></tr>
<tr><td>163</td><td>—</td><td>—</td><td>—</td><td>—</td><td>0.850</td><td>0.050</td><td>Ce</td><td>3.500</td><td>—</td><td>—</td><td>3.5</td></tr>
<tr><td>164</td><td>—</td><td>—</td><td>—</td><td>—</td><td>0.850</td><td>0.050</td><td>La</td><td>2.800</td><td>—</td><td>—</td><td>2.8</td></tr>
</table>

[Table 5]

TABLE 5

<table>
<tr><th rowspan="2">Sample No.</th><th colspan="2">Second A layer</th><th colspan="2">Third A layer</th><th rowspan="2">Coating thickness [μm]</th><th>Cutting test 3</th><th>Cutting test 4</th></tr>
<tr><th>Composition</th><th>Thickness [μm]</th><th>Composition</th><th>Thickness [μm]</th><th>Cutting time [min]</th><th>Cut length [km]</th></tr>
<tr><td>51</td><td>—</td><td>—</td><td>—</td><td>—</td><td>3.3</td><td>91</td><td>8.2</td></tr>
<tr><td>52</td><td>—</td><td>—</td><td>—</td><td>—</td><td>3.4</td><td>93</td><td>8.7</td></tr>
<tr><td>53</td><td>—</td><td>—</td><td>—</td><td>—</td><td>3.1</td><td>92</td><td>8.4</td></tr>
<tr><td>54</td><td>—</td><td>—</td><td>—</td><td>—</td><td>3.6</td><td>85</td><td>7.3</td></tr>
<tr><td>55</td><td>—</td><td>—</td><td>—</td><td>—</td><td>3.0</td><td>87</td><td>7.5</td></tr>
<tr><td>56</td><td>—</td><td>—</td><td>—</td><td>—</td><td>3.8</td><td>88</td><td>7.8</td></tr>
<tr><td>57</td><td>—</td><td>—</td><td>—</td><td>—</td><td>3.1</td><td>94</td><td>8.4</td></tr>
<tr><td>58</td><td>—</td><td>—</td><td>—</td><td>—</td><td>2.7</td><td>84</td><td>7.2</td></tr>
<tr><td>59</td><td>—</td><td>—</td><td>—</td><td>—</td><td>2.8</td><td>82</td><td>7.1</td></tr>
<tr><td>60</td><td>—</td><td>—</td><td>—</td><td>—</td><td>3.0</td><td>86</td><td>7.4</td></tr>
<tr><td>61</td><td>—</td><td>—</td><td>—</td><td>—</td><td>3.5</td><td>85</td><td>7.3</td></tr>
<tr><td>62</td><td>—</td><td>—</td><td>—</td><td>—</td><td>3.0</td><td>89</td><td>8.0</td></tr>
<tr><td>63</td><td>—</td><td>—</td><td>—</td><td>—</td><td>3.5</td><td>88</td><td>7.9</td></tr>
<tr><td>64</td><td>—</td><td>—</td><td>—</td><td>—</td><td>3.6</td><td>91</td><td>8.3</td></tr>
<tr><td>65</td><td>—</td><td>—</td><td>—</td><td>—</td><td>2.8</td><td>93</td><td>8.7</td></tr>
<tr><td>66</td><td>—</td><td>—</td><td>—</td><td>—</td><td>3.5</td><td>87</td><td>7.6</td></tr>
<tr><td>67</td><td>—</td><td>—</td><td>—</td><td>—</td><td>3.6</td><td>81</td><td>7.0</td></tr>
<tr><td>68</td><td>—</td><td>—</td><td>—</td><td>—</td><td>2.8</td><td>85</td><td>7.5</td></tr>
<tr><td>69</td><td>—</td><td>—</td><td>—</td><td>—</td><td>3.5</td><td>87</td><td>7.7</td></tr>
<tr><td>70</td><td>—</td><td>—</td><td>—</td><td>—</td><td>3.0</td><td>93</td><td>8.3</td></tr>
<tr><td>71</td><td>—</td><td>—</td><td>—</td><td>—</td><td>2.8</td><td>72</td><td>6.4</td></tr>
<tr><td>72</td><td>—</td><td>—</td><td>—</td><td>—</td><td>3.2</td><td>82</td><td>7.1</td></tr>
<tr><td>73</td><td>WC$_{0.40}$N$_{0.60}$</td><td>0.6</td><td>—</td><td>—</td><td>4.6</td><td>94</td><td>9.2</td></tr>
<tr><td>74</td><td>—</td><td>—</td><td>—</td><td>—</td><td>5.0</td><td>91</td><td>8.6</td></tr>
<tr><td>75</td><td>Ti$_{0.90}$Si$_{0.08}$B$_{0.02}$</td><td>0.5</td><td>—</td><td>—</td><td>3.8</td><td>85</td><td>7.7</td></tr>
<tr><td>76</td><td>WC$_{0.40}$N$_{0.60}$</td><td>0.7</td><td>Ti$_{0.95}$Si$_{0.02}$B$_{0.03}$</td><td>0.6</td><td>4.6</td><td>98</td><td>9.7</td></tr>
<tr><td>77</td><td>—</td><td>—</td><td>—</td><td>—</td><td>0.5</td><td>81</td><td>7.2</td></tr>
<tr><td>78</td><td>—</td><td>—</td><td>—</td><td>—</td><td>15.0</td><td>105</td><td>9.8</td></tr>
</table>

[Table 6]

TABLE 6

| Sample No. | Second A layer Composition | Thickness [μm] | Third A layer Composition | Thickness [μm] | Coating thickness [μm] | Cutting test 3 Cutting time [min] | Cutting test 4 Cut length [km] |
|---|---|---|---|---|---|---|---|
| 151 | — | — | — | — | 3.3 | 31 | 2.6 |
| 152 | — | — | — | — | 3.3 | 27 | 2.7 |
| 153 | — | — | — | — | 3.0 | 30 | 2.5 |
| 154 | — | — | — | — | 3.8 | 28 | 2.3 |
| 155 | — | — | — | — | 3.8 | 33 | 3.2 |
| 156 | — | — | — | — | 2.8 | 24 | 1.7 |
| 157 | — | — | — | — | 3.6 | 25 | 1.6 |
| 158 | — | — | — | — | 3.6 | 20 | 1.3 |
| 159 | — | — | — | — | 3.6 | 25 | 2.3 |
| 160 | — | — | — | — | 3.1 | 19 | 1.2 |
| 161 | — | — | — | — | 3.3 | 24 | 1.7 |
| 162 | — | — | — | — | 3.1 | 23 | 1.5 |
| 163 | — | — | — | — | 3.5 | 21 | 1.8 |
| 164 | — | — | — | — | 2.8 | 24 | 2.2 |

<<Evaluation>>

On the cutting tool according to each sample, measured were the composition of the first unit layer, the composition of the third unit layer, the composition of the second A layer, the composition of the third A layer, the number of stacking of each of the first unit layers and the third unit layers, the average thickness of the first unit layers, the average thickness of the third unit layers, the thickness of the first A layer, the thickness of the second A layer, the thickness of the third A layer, λ3/λ1, crystal structure of the first unit layer, and hardness of the coating. A measurement method of each item is as described in Example 1. The results are shown in Table 3 to Table 6.

<Measurement of Hardness of Coating>

Hardness of the coating of Sample 51 to Sample 78 was measured by the method described in Embodiment 1. The hardness of the coating of these samples was confirmed to be within a range of 30 GPa or more and 55 GPa or less.

<Cutting Test 3: Continuous Turning Test>

With the cutting tool of each sample that had a CNMG120408 shape, dry continuous turning test was performed under the following cutting conditions to measure a time until an amount of wear on a flank face of a cutting edge reached 0.2 mm. The results are shown in the column "Cutting time [min]" in Table 5 to Table 6. In Table 5 to Table 6, a longer cutting time indicates a longer tool lifetime.

(Cutting Conditions)

Workpiece: Inconel 718 (aging agent: HB=400)
Cutting rate: 70 m/min
Feeding rate: 0.15 mm/rev
Depth of cut: 1.0 mm
Coolant: dry The cutting processing performed under the above cutting conditions is high-speed high-efficiency processing of a hard-to-cut material, and corresponds to cutting processing performed under conditions of high cutting edge temperature.

The cutting tools of Sample 51 to Sample 78 correspond to Examples, and the cutting tools of Sample 151 to Sample 164 correspond to Comparative Examples. The cutting tools of Sample 51 to Sample 78 were confirmed to have a long tool lifetime compared with the cutting tools of Sample 151 to Sample 164 in the cutting processing performed under the conditions of high cutting edge temperature.

<Cutting Test 4: Milling Test>

With the cutting tool of each sample that had a SEMT13T3AGSN shape, surface milling was performed under the following cutting conditions by fitting: a center line of a plate made of a hard-to-cut material with 150 mm in width; and a center of the cutter with CD160 mm, which was wider than the plate, to measure a cut length until an amount of wear on a flank face of a cutting edge reached 0.2 mm. The results are shown in the column "Cut length [km]" in Table 5 to Table 6. In Table 5 to Table 6, a longer cut length indicates a longer lifetime.

<<Cutting Conditions>>

Workpiece: FCD700 (HB=250)
Cutting rate: 260 m/min
Feeding rate: 0.2 mm/t
Axial depth of cut "ap": 2.0 mm
Radial depth of cut "ae": 150 mm
Coolant: dry The cutting processing performed under the above cutting conditions is high-speed high-efficiency milling of a hard-to-cut material under a dry condition, and corresponds to cutting processing performed under conditions of high cutting edge temperature.

The cutting tools of Sample 51 to Sample 78 correspond to Examples, and the cutting tools of Sample 151 to Sample 164 correspond to Comparative Examples. The cutting tools of Sample 51 to Sample 78 were confirmed to have a long tool lifetime compared with the cutting tools of Sample 151 to Sample 164 in the cutting processing performed under the conditions of high cutting edge temperature.

The embodiments and Examples of the present disclosure have been described as above, but it is anticipated in advance that the aforementioned constitution of embodiments and Examples are appropriately combined or variously modified.

The embodiments and Examples disclosed herein are examples in all points, and should not be limitative. The scope of the present invention is determined by not the above embodiments nor Examples but claims, and intended to include meaning equivalent to claims and all modification within the scope.

REFERENCE SIGNS LIST

1 Cutting tool; 2 Base; 3 Coating; 12 First unit layer; 13 First layer; 13A First A layer; 14 Third layer; 14A Third A layer; 15 Second unit layer; 16 Second layer; 16A Second A layer; 17 Third unit layer; 101 Chamber; 102 Gas; 103 Gas discharging port; 104 Base holder; 105 Gas introducing port; 106, 107, 120 Cathode; 108, 109 Arc power source; 110 Bias power source

The invention claimed is:

1. A cutting tool, comprising:
a base; and
a coating disposed on the base, wherein
the coating includes a first layer,
the first layer is composed of an alternate layer in which a first unit layer and a second unit layer are alternately stacked,
the first unit layer has a hexagonal crystal structure,
the first unit layer is composed of $W(C_{1-a}Na)_x$,
a represents 0.3 or more and 0.8 or less,
x represents 0.8 or more and 1.2 or less,
the second unit layer is composed of $Ti_cSi_{1-c}N$, and
c represents 0.80 or more and 0.99 or less.

2. The cutting tool according to claim 1, wherein in the first unit layer and the second unit layer adjacent to the first unit layer, a ratio $\lambda 2/\lambda 1$ of a thickness $\lambda 2$ μm of the second unit layer to a thickness $\lambda 1$ μm of the first unit layer is 1.0 or more and 5.0 or less.

3. The cutting tool according to claim 1, wherein
an average thickness of the first unit layer is 0.002 μm or more and 0.2 μm or less, and
an average thickness of the second unit layer is 0.002 μm or more and 0.2 μm or less.

4. The cutting tool according to claim 1, wherein
the coating further includes a second layer disposed between the base and the first layer, and
a composition of the second layer is same as a composition of the first unit layer or a composition of the second unit layer.

5. The cutting tool according to claim 4, wherein
the composition of the second layer is same as the composition of the first unit layer, and
a thickness of the second layer is larger than a thickness of the first unit layer.

6. The cutting tool according to claim 4, wherein
the composition of the second layer is same as the composition of the second unit layer, and
a thickness of the second layer is larger than a thickness of the second unit layer.

7. The cutting tool according to claim 1, wherein
the coating further includes a third layer provided on a side opposite to the base of the first layer, and
the third layer is composed of TiSiCN.

8. A cutting tool, comprising:
a base; and
a coating disposed on the base, wherein
the coating includes a first A layer,
the first A layer is composed of an alternate layer in which a first unit layer and a third unit layer are alternately stacked,
the first unit layer has a hexagonal crystal structure,
the first unit layer is composed of $W(C_{1-a}Na)_x$,
a represents 0.3 or more and 0.8 or less,
x represents 0.8 or more and 1.2 or less,
the third unit layer is composed of $Ti_dSi_{1-d-e}M_eN$,
M represents boron, yttrium, cerium, or lanthanum,
d represents 0.80 or more and 0.99 or less, and
e represents more than 0 and 0.05 or less.

9. The cutting tool according to claim 8, wherein in the first unit layer and the third unit layer adjacent to the first unit layer, a ratio $\lambda 3/\lambda 1$ of a thickness $\lambda 3$ μm of the third unit layer to a thickness $\lambda 1$ μm of the first unit layer is 1.0 or more and 5.0 or less.

10. The cutting tool according to claim 8, wherein M represents boron.

11. The cutting tool according to claim 8, wherein
an average thickness of the first unit layer is 0.002 μm or more and 0.2 μm or less, and
an average thickness of the third unit layer is 0.002 μm or more and 0.2 μm or less.

12. The cutting tool according to claim 8, wherein
the coating further includes a second A layer disposed between the base and the first A layer, and
a composition of the second A layer is same as a composition of the first unit layer or a composition of the third unit layer.

13. The cutting tool according to claim 12, wherein
the composition of the second A layer is same as the composition of the first unit layer, and
a thickness of the second A layer is larger than a thickness of the first unit layer.

14. The cutting tool according to claim 12, wherein
the composition of the second A layer is same as the composition of the third unit layer, and
a thickness of the second A layer is larger than a thickness of the third unit layer.

15. The cutting tool according to claim 8, wherein
the coating further includes a third A layer provided on a side opposite to the base of the first A layer,
the third A layer is composed of TiSiMeCN, and
Me represents boron, yttrium, cerium, or lanthanum.

\* \* \* \* \*